(12) United States Patent
Fujimori et al.

(10) Patent No.: US 6,984,973 B2
(45) Date of Patent: Jan. 10, 2006

(54) PART TRANSFER APPARATUS, CONTROL METHOD FOR PART TRANSFER APPARATUS, IC TEST METHOD, IC HANDLER, AND IC TEST APPARATUS

(75) Inventors: Hiroaki Fujimori, Suwa (JP); Masami Maeda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 383 days.

(21) Appl. No.: 10/072,451

(22) Filed: Feb. 5, 2002

(65) Prior Publication Data

US 2002/0195313 A1 Dec. 26, 2002

(30) Foreign Application Priority Data

Feb. 8, 2001 (JP) ........................ 2001-032191

(51) Int. Cl.
*G01R 31/26* (2006.01)

(52) U.S. Cl. ................... 324/158.1; 198/346.2; 198/198; 198/468.2

(58) Field of Classification Search .............. 324/158.1, 324/765, 754, 72.3, 73.1; 198/346.2, 468.2, 198/468.4, 409; 414/225, 226; 29/593, 594, 29/537
See application file for complete search history.

(56) References Cited

U.S. PATENT DOCUMENTS

| | | | | |
|---|---|---|---|---|
| 4,690,050 A | * | 9/1987 | Rouly et al. | ................... 101/35 |
| 5,330,043 A | * | 7/1994 | Stuckey | ................... 198/346.2 |
| 6,102,649 A | | 8/2000 | Ogawa et al. | |
| 6,111,417 A | | 8/2000 | Kojima | |

FOREIGN PATENT DOCUMENTS

| | | |
|---|---|---|
| EP | 0 995 542 A2 | 4/2000 |
| GB | 2 172 257 A | 9/1986 |
| JP | 11-281708 | 10/1999 |
| JP | 11-326451 | 11/1999 |
| WO | WO 98/41366 | 9/1998 |

* cited by examiner

*Primary Examiner*—Kamand Cuneo
*Assistant Examiner*—Jimmy Nguyen
(74) *Attorney, Agent, or Firm*—Mark P. Watson

(57) ABSTRACT

A configuration having two drive shafts, a drive system 4 connected to one end of each drive shaft for rotationally driving the respective drive shaft, and a holding and transfer mechanism 5, 6 connected to the other end and having a holding device 5a, 6a for holding an IC, each holding and transfer mechanism 5, 6 being able to operate independently.

29 Claims, 15 Drawing Sheets

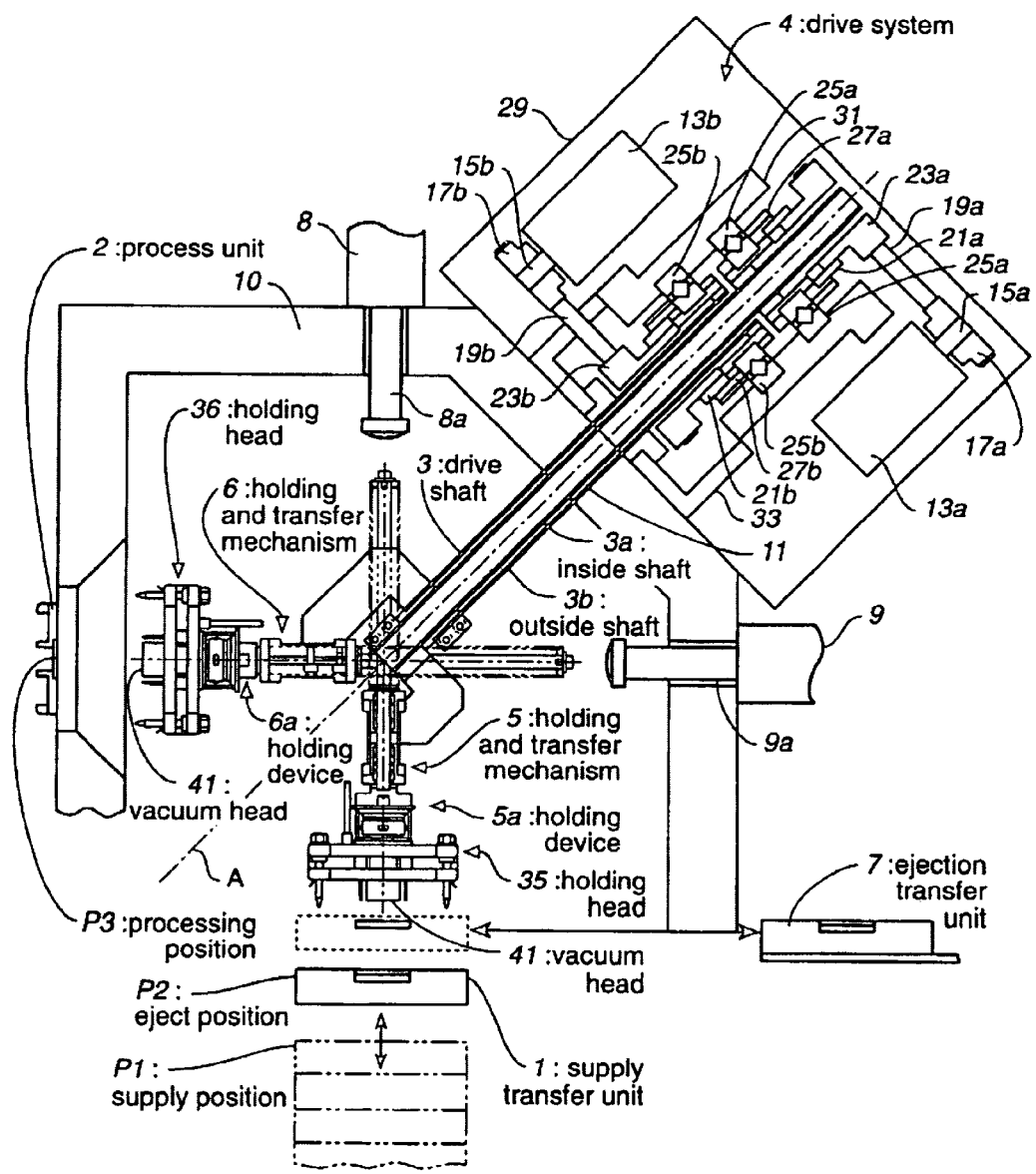
FIG._1

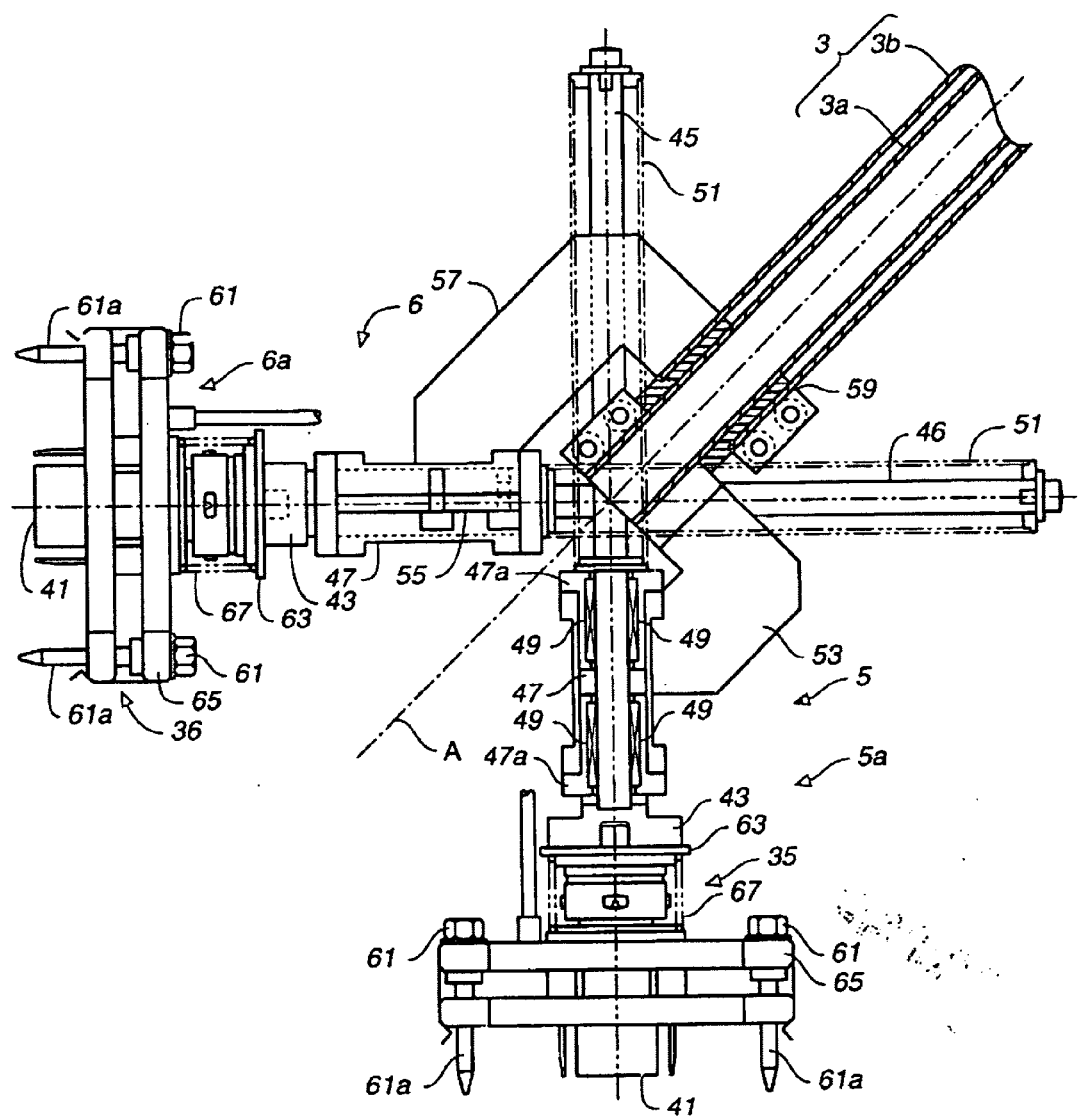
FIG._2

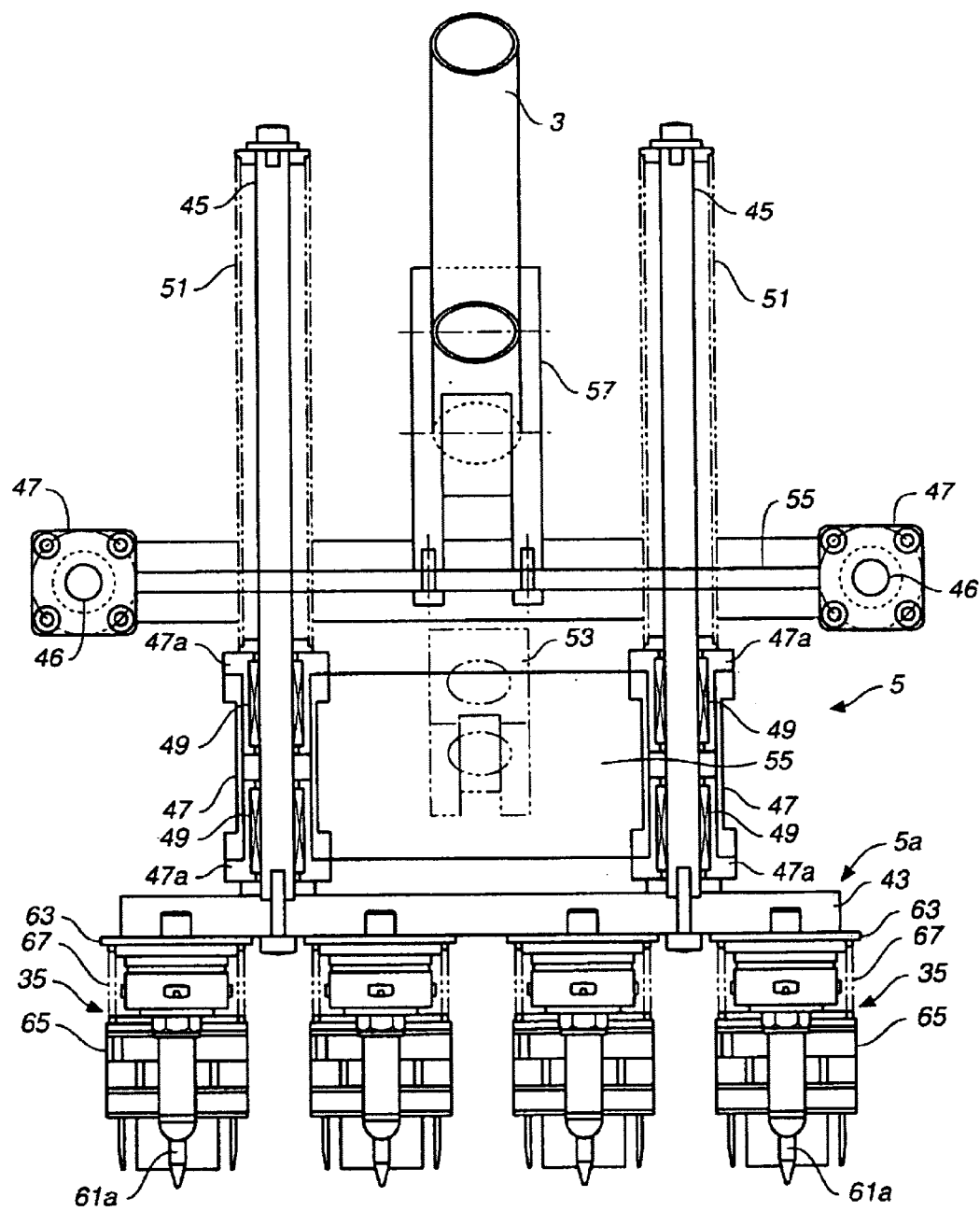
FIG._3

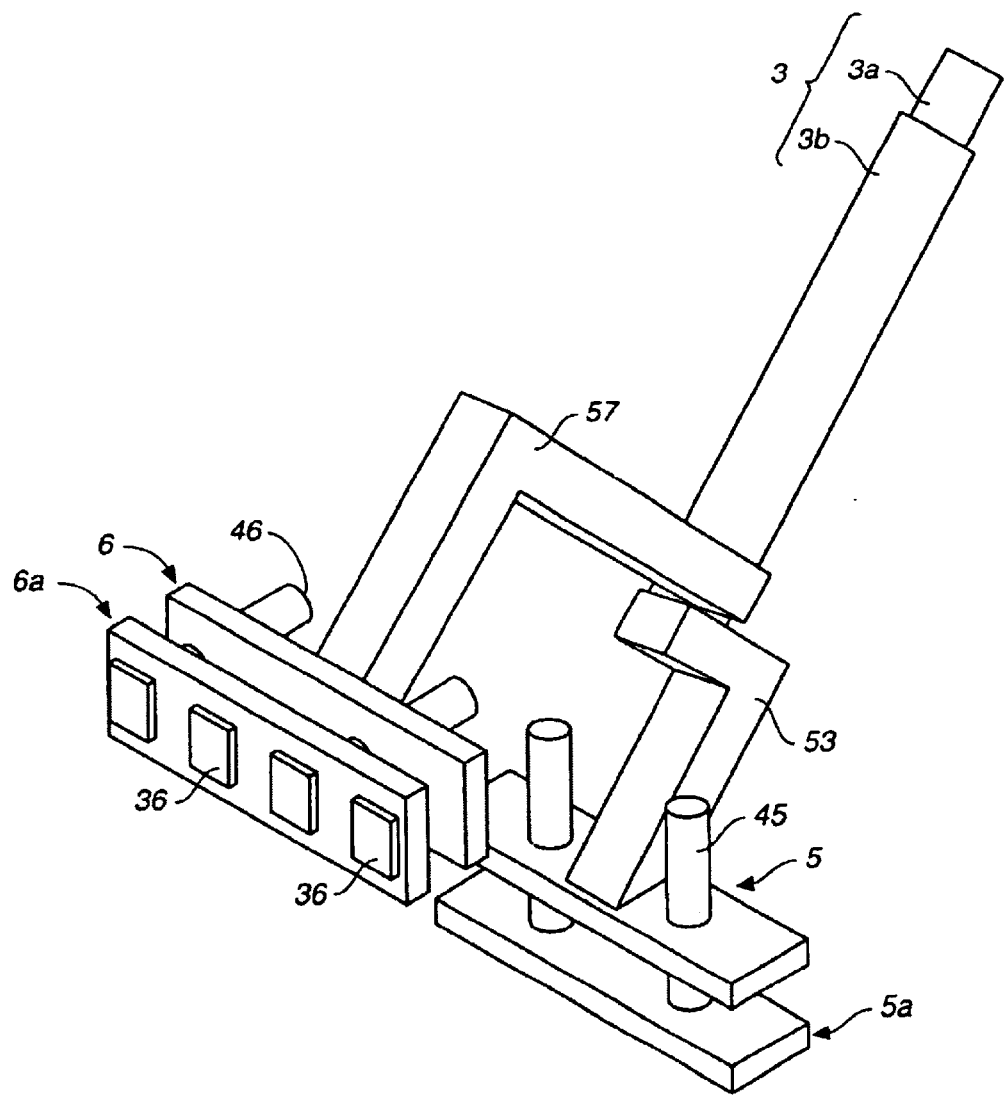
FIG._4

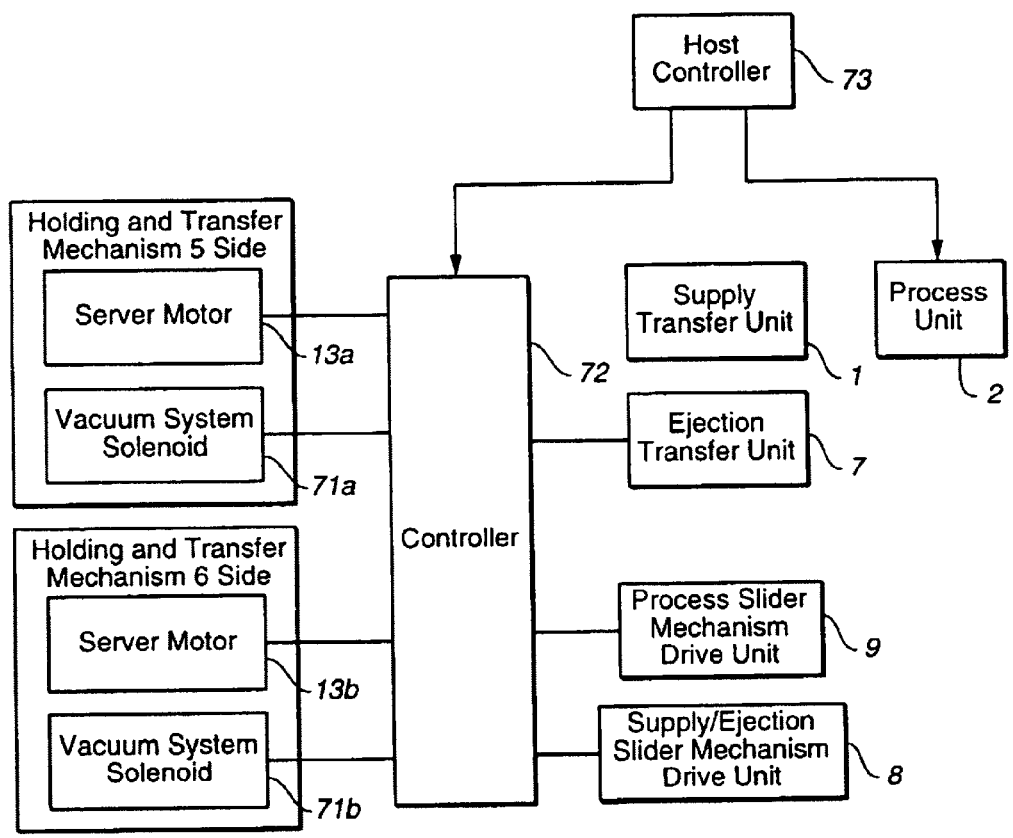
FIG._5

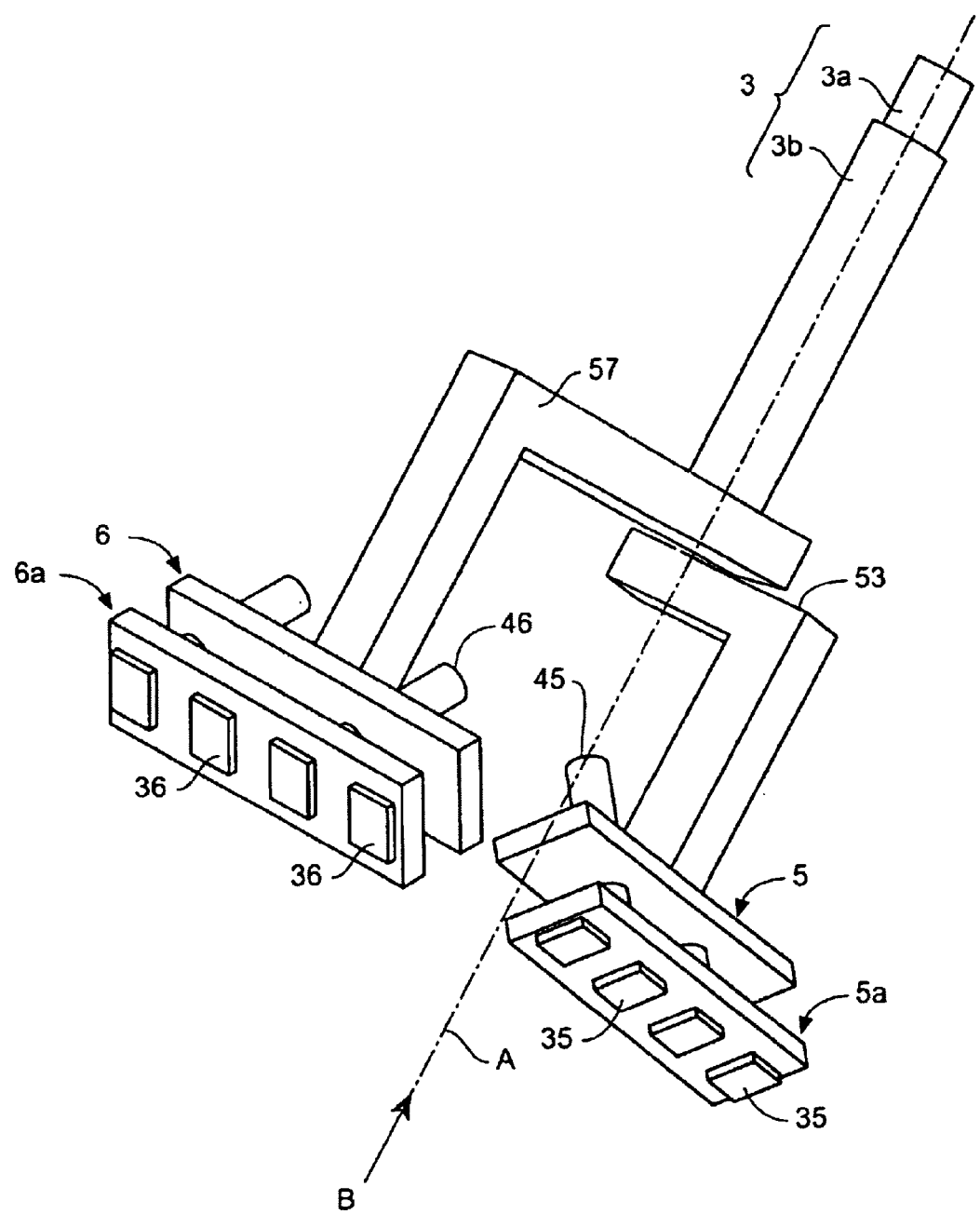
FIG._6

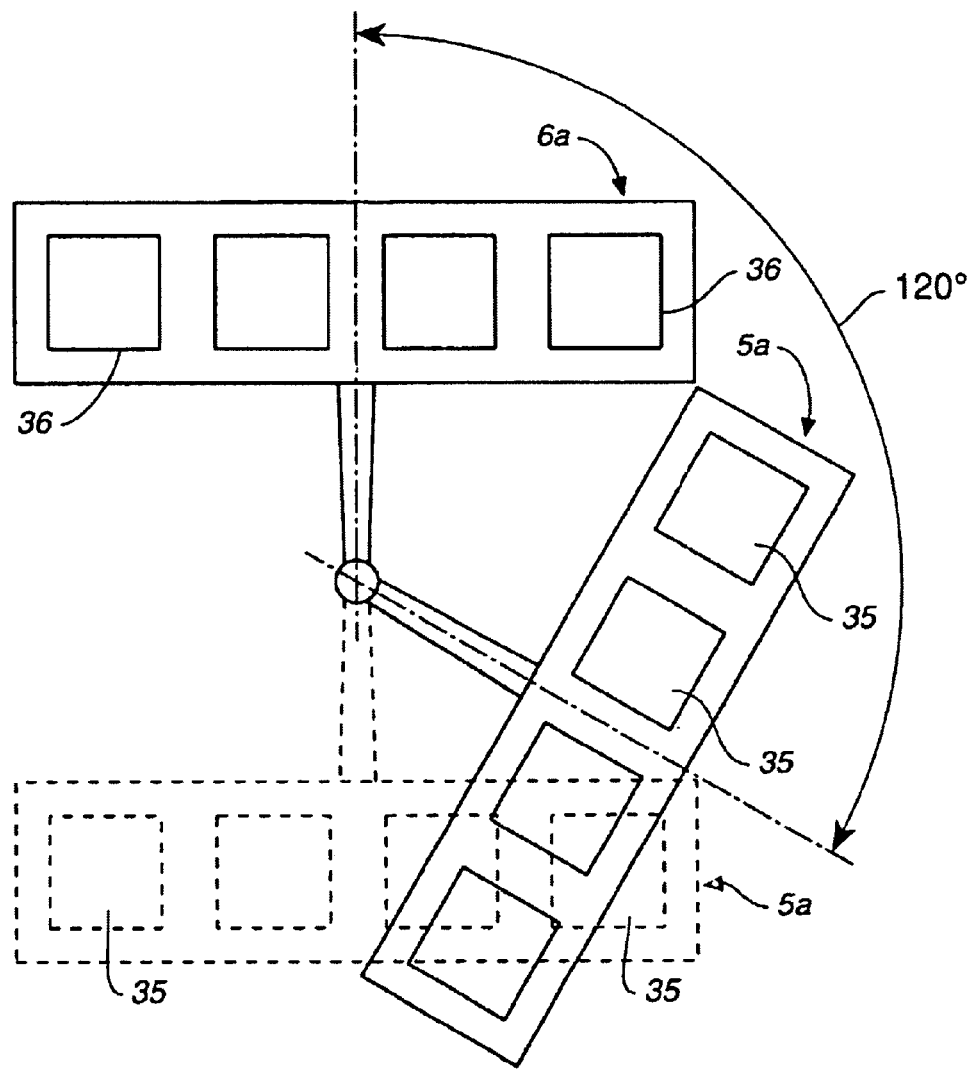
FIG._7

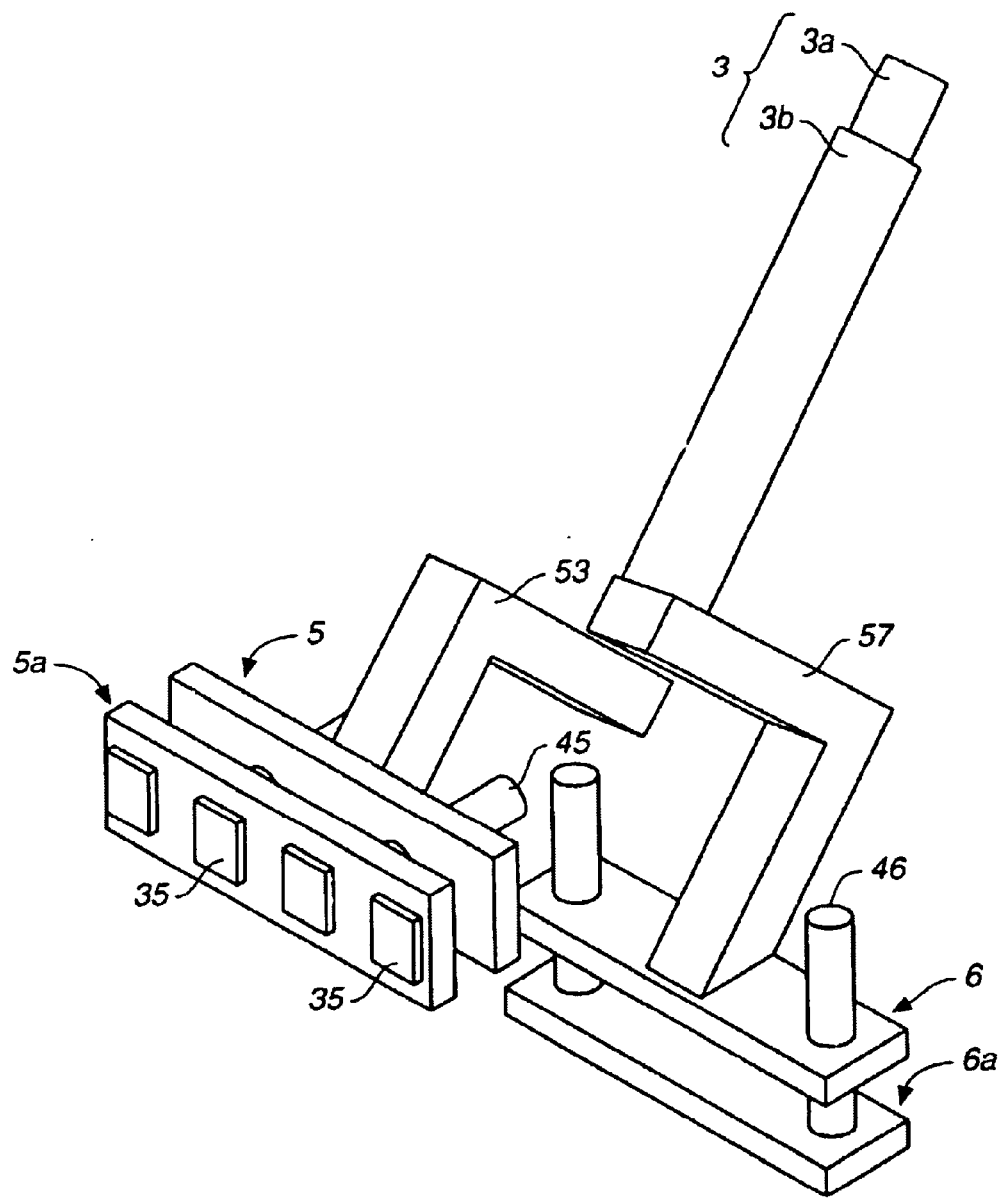
FIG._8

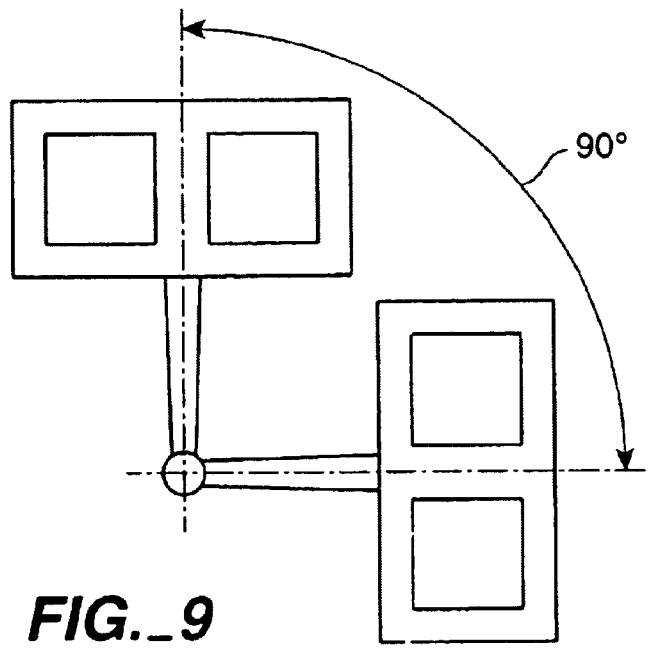
FIG._9
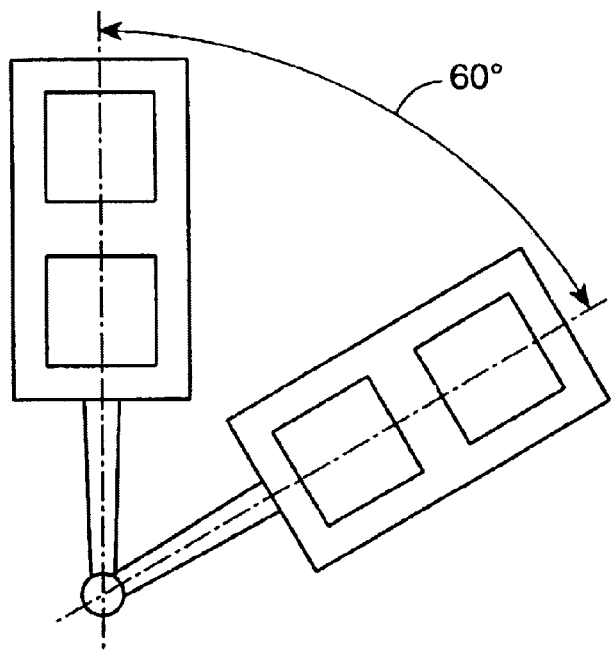
FIG._10

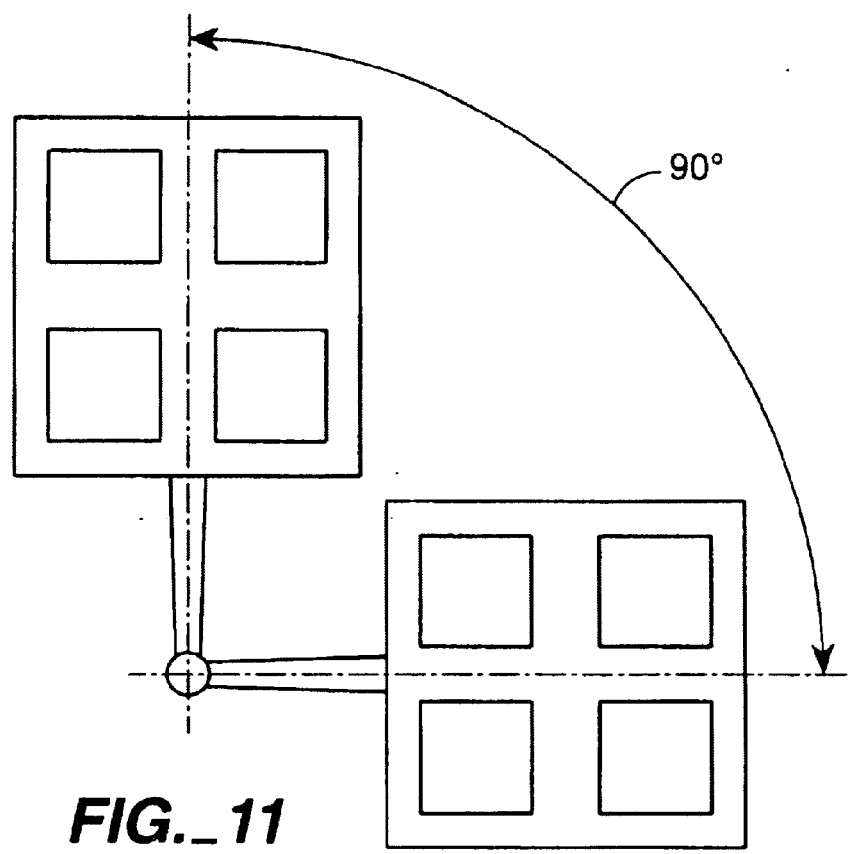
FIG._11
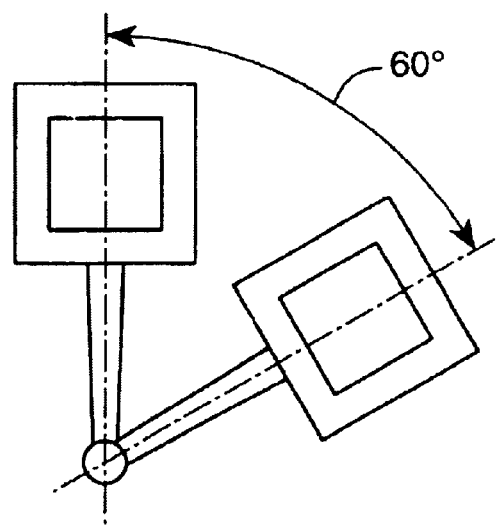
FIG._12

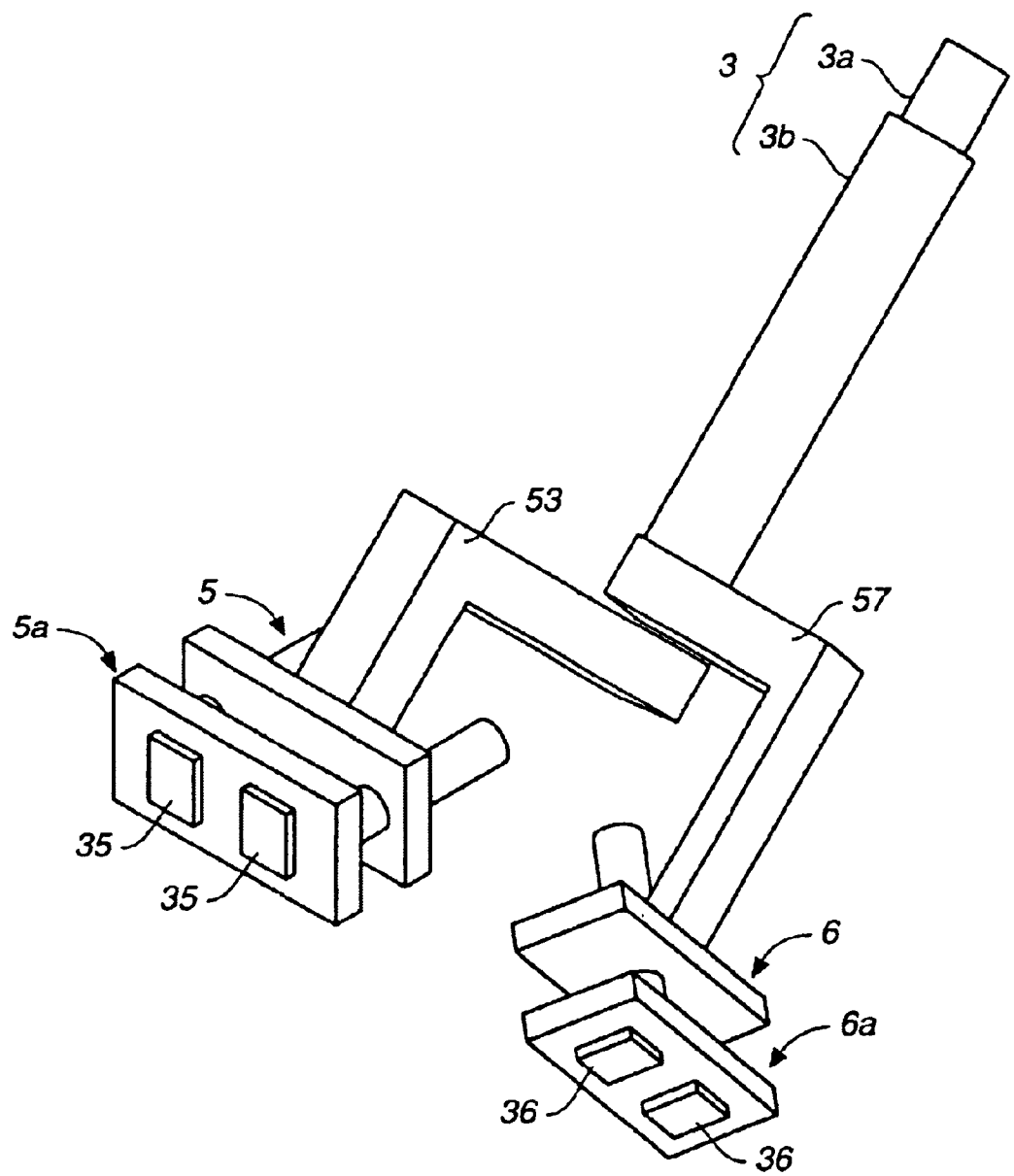
FIG._13

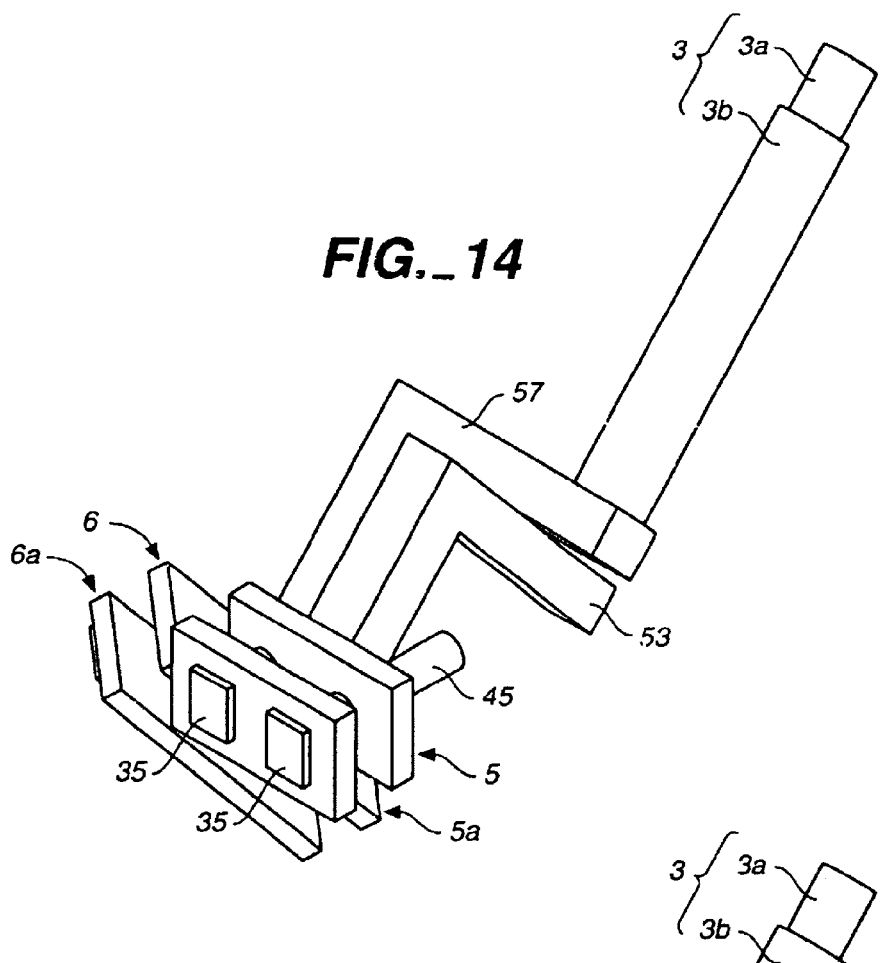
FIG._14
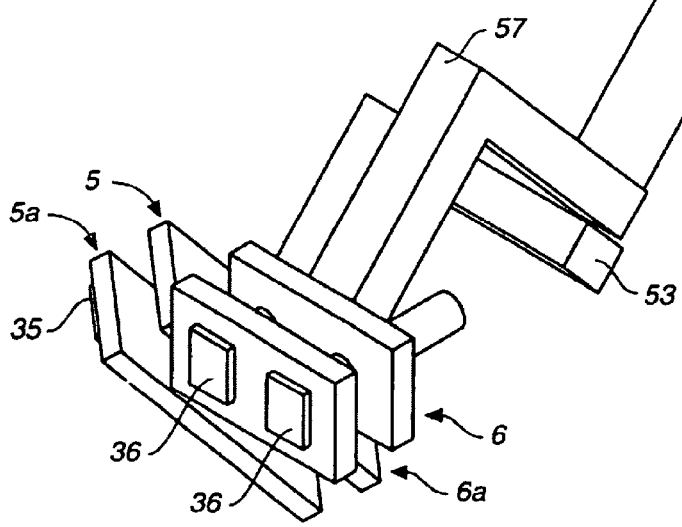
FIG._15

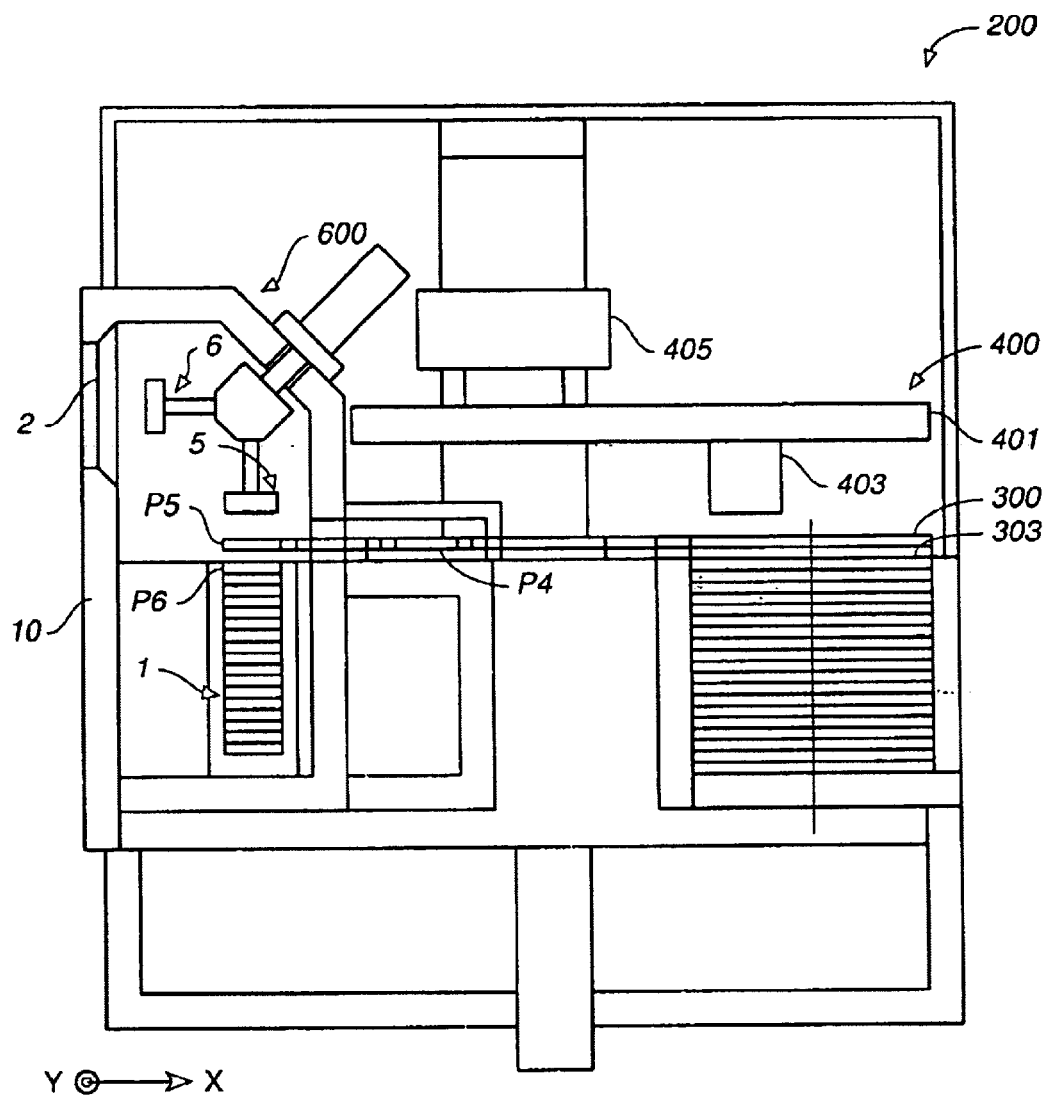
FIG._16

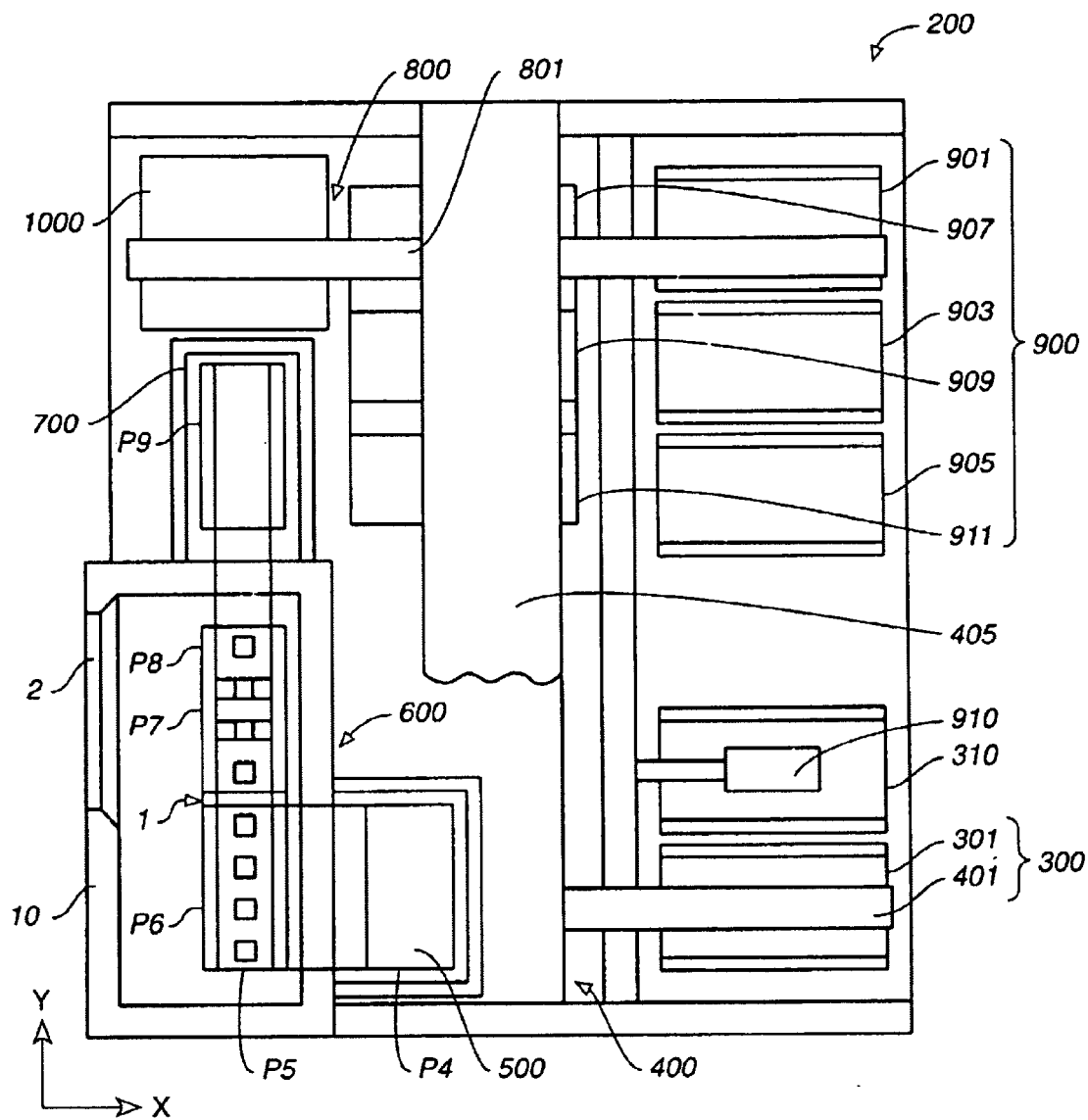
FIG._17

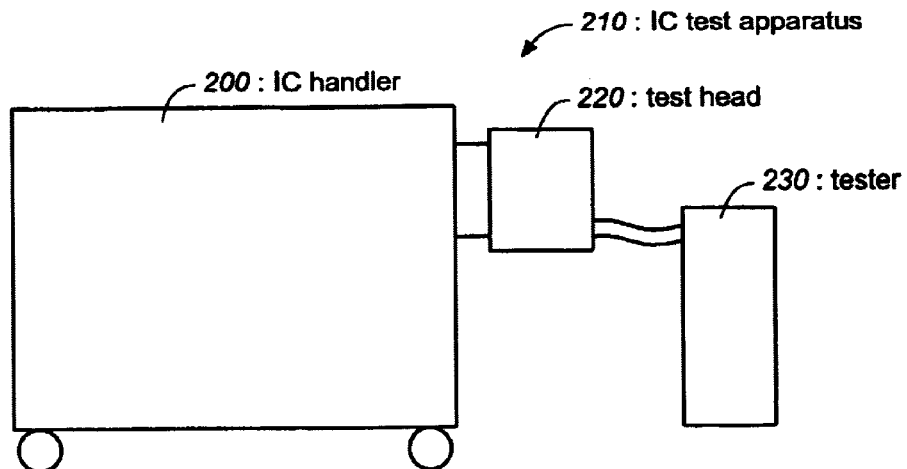
FIG._18
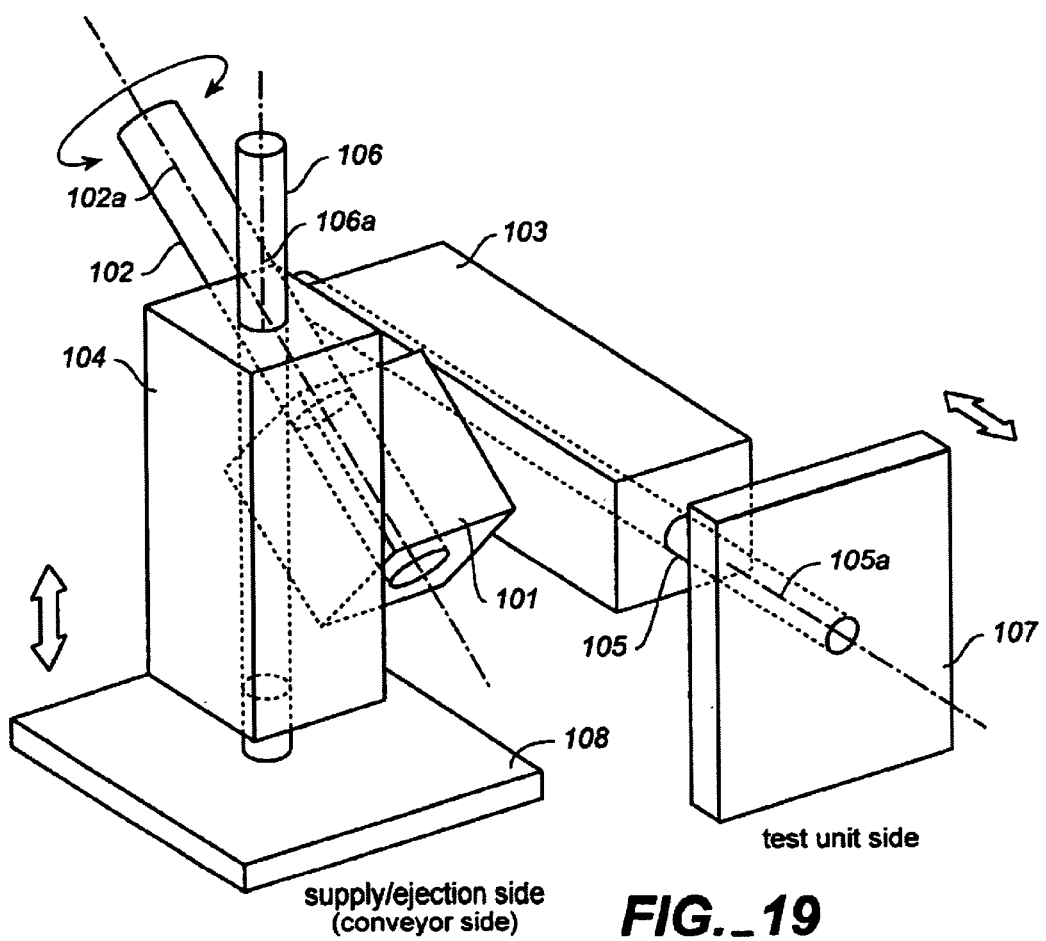
FIG._19
PRIOR ART

the left and returns to the original position. The pick-up head 108, however, slides down and ejects the vacuum chucked part to the conveyor, then rises up once, picks up a new part from the conveyor, which has moved, and then returns to the original position before sliding.

PART TRANSFER APPARATUS, CONTROL METHOD FOR PART TRANSFER APPARATUS, IC TEST METHOD, IC HANDLER, AND IC TEST APPARATUS

TECHNICAL FIELD

The present invention relates to a part transfer apparatus, to a control method for a part transfer apparatus, to an IC handler, and to an IC test method, and relates particularly to a part handling apparatus for supplying and removing electronic parts to an electrical test step or other such process, to a control method for a part handling apparatus, to an IC test method, to an IC handler, and to an IC test apparatus.

RELATED ART

IC handlers have conventionally been used to sequentially position and test a large number of IC devices in a test position in processes for inspecting integrated circuit (IC) characteristics. The IC handler has a holding device for vacuum chucking the IC devices. This holding device repeats an operation whereby the IC is held in the supply transfer unit, the held IC device is supplied to an inspection socket disposed to the inspection position, and when testing the electrical characteristics of the IC device is completed, the IC device is removed from the test socket and transferred to the ejecting position.

The ability to inspect large numbers of IC devices in a short time is needed in characteristic inspection processes using an IC handler. Shortening the time required to remove a tested IC device from the test unit and transfer the next IC device to the test unit, that is, the index time, which is the time required to replace the holding device to the test unit, is therefore a most important consideration.

Technology taught in U.S. Pat. No. 5,330,043 is an example of a conventional transfer apparatus for electronic parts directed to shortening the index time. FIG. 19 is a schematic diagram of the transfer apparatus. This transfer apparatus has a support block 101 at one end, a rotationally driven drive shaft 102, guide blocks 103, 104 attached to the sides of the support block, a shaft 105 slidably supported in a through-hole in guide block 103 in the direction of axis 105a at an angle of 45 degrees to the rotational axis 102a of the drive shaft 102, a pick-up head 107 affixed to one end of the shaft 105 and extending and retracting in a reciprocating action in the direction of axis 105a, a shaft 106 slidably supported in a through-hole in guide block 104 and disposed in the direction of axis 106a perpendicular to axis 105a at a 45 degree angle to the rotational axis 102a of drive shaft 102, and a pick-up head 108 affixed to one end of shaft 106 and extending and retracting in a reciprocating action in the direction of axis 106a, and is configured so that pick-up head 107 and pick-up head 108 change positions as a result of 180 degree rotation of drive shaft 102.

With the transfer apparatus thus comprised the conveyor (not shown in the figure) whereby parts are supplied and ejected is disposed on a horizontal plane and the test unit (not shown in the figure) is disposed on a vertical plane. In the figure it is assumed that the pick-up head 107 has a part to be inspected (not shown in the figure) vacuum chucked with a suction cup not shown in the figure opposite the test unit, and the pick-up head 108 is holding an inspected part opposite a supply conveyor (not shown in the figure) below in the vertical direction. From these positions the pick-up head 107 slides to the right to push the held part to the test unit for inspection, and after testing is completed slides to The drive shaft 102 then rotates 180 degrees and simultaneously to the pick-up head 107 holding the tested part reaching the conveyor, the pick-up head 108 holding an untested part reaches the position opposite the test unit, and the test unit side and supply/ejection side (conveyor side) operations repeat as described above. The drive shaft 102 then turns in reverse direction so that the pick-up head 108 holding the tested part reaches the position above the conveyor and the pick-up head 107 holding the untested part reaches the position opposite the test unit simultaneously. As thus described, this technology is a technology that seeks to shorten the index time by simultaneously operating two pick-up heads while turning a drive shaft 102 180 degrees in forward and reverse directions so that testing is performed with one pick-up head while the other head simultaneously ejects a tested part and picks up another.

A problem with the transfer apparatus described above is that because pick-up heads 107 and 108 are connected to the same drive shaft 102, positioning pick-up head 107 on the test unit side and positioning pick-up head 108 on the supply/eject side must be accomplished simultaneously, and the positions cannot be independently corrected.

The above-described mechanism, that is, a mechanism for alternately transporting two pick-up heads mounted to drive shafts so as to be perpendicular to each other and held at a 45 angle to a rotationally driven drive shaft, is often used in electronic part test processes in high temperature and low temperature environments, and the test process is set to occur at a constant set temperature within a temperature range of, for example, −55 degrees to 150 degrees. This set temperature can be appropriately changed and the above-noted mechanism operates under each set temperature, but when the temperature difference between the previous temperature setting and the current temperature setting is great, the length of mechanical parts of the internal mechanism changes due to thermal expansion or contraction, and there is the problem that the pick-up head position changes from the last adjusted position. It is therefore necessary to correct this shift, but it is extremely difficult to correct the position of both pick-up heads simultaneously.

There is the further problem that a stable measurement environment free of vibrations, for example, is desirable for electrical measurements of electronic parts in the test unit, but while one pick-up head is operating at the test unit the other pick-up head is operating to eject a tested electronic part and supply the next part, and because high speed is required in the ejection and supply operation accompanying vibrations from the supply unit and ejection unit can be transferred to the pick-up head on the test unit side, and could possibly have some adverse effect on electronic part measurements, for example.

The present invention is directed to these problems, and a first object of the invention is to provide a part transfer apparatus capable of further shortening the index time, a control method for the part transfer apparatus, an IC test method, an IC handler, and an IC test apparatus.

In addition to the above first object, a second object of the present invention is to provide a part transfer apparatus that is capable of independent positioning correction and reducing the effects of vibration so as to stably perform a process in the processing unit, a control method for a part transfer apparatus, an IC test method, an IC handler, and an IC test apparatus.

SUMMARY OF THE INVENTION (1) A part transfer apparatus according to one aspect of the present invention comprises: a plurality of drive shafts coaxially disposed, each having a drive system connected to one end and rotationally driven by the drive system; and a plurality of holding and transfer mechanisms respectively mounted to the plural drive shafts and having a holding device for holding a part.

(2) A part transfer apparatus according to another aspect of the present invention comprises: a first drive shaft and a second drive shaft coaxially disposed, each having a drive system connected to one end and rotationally driven by the drive system; a first holding and transfer mechanism mounted to the first drive shaft and having a first holding device for holding a part; and a second holding and transfer mechanism mounted to the second drive shaft and having a second holding device for holding a part.

Because each of the holding and transfer mechanisms operates independently with (1) and (2) above, an operation is possible whereby when transferring parts held in the holding device to a specific position, the other holding and transfer mechanism can be made to wait with a part held in each holding device while the one holding and transfer mechanism is transferring, and index time can be shortened. Furthermore, because each shaft is rotationally driven by respective independent drive systems, the effects of vibration on each other can be prevented.

(3) A part transfer apparatus according to another aspect of the present invention is as in (2) above with the second drive shaft being hollow and the first drive shaft passing through and disposed coaxially to the second drive shaft.

(4) A part transfer apparatus according to another aspect of the present invention is as in (3) above with one end on the drive system side of the first drive shaft and second drive shaft being axially supported by a bearing, and a spacer for maintaining a space between the drive shafts being disposed at the other end in the space between the first drive shaft and second drive shaft.

With (3) and (4) above the first drive shaft and second drive shaft are driven with the gap therebetween maintained, and the effects of vibration on each other can be prevented.

(5) A part transfer apparatus according to another aspect of the present invention is as in any of (2) to (4) above wherein the first holding and transfer mechanism is mounted to the first drive shaft so that the holding surface of the first holding device is at an angle of 45 degrees to the drive shaft, and the second holding and transfer mechanism is mounted to the second drive shaft so that the holding surface of the second holding device is at an angle of 45 degrees to the drive shaft.

With (5) above parts can be transferred between positions disposed on mutually perpendicular planes by means of drive shaft rotation.

(6) A part transfer apparatus according to another aspect of the present invention is as in any of (2) to (5) wherein the first holding and transfer mechanism has a first support mechanism for slidably supporting the first holding device in a direction perpendicular to its holding surface, and the second holding and transfer mechanism has a second support mechanism for slidably supporting the second holding device in a direction perpendicular to its holding surface.

(7) A part transfer apparatus according to another aspect of the present invention is as in (6) above wherein the first holding and transfer mechanism is mounted to the first drive shaft connecting the first drive shaft and the first support mechanism, and the second holding and transfer mechanism is mounted to the second drive shaft connecting the second drive shaft and the second support mechanism.

(8) A part transfer apparatus according to another aspect of the present invention is as in any of (2) to (7) above wherein the first holding and transfer mechanism and the second holding and transfer mechanism are alternately moved by rotation of each drive shaft to a supply transfer unit for supplying parts and a process unit for applying a specific process to the parts.

(9) A part transfer apparatus according to another aspect of the present invention is as in (8) above wherein the first holding and transfer mechanism and the second holding and transfer mechanism eject parts finished processing in the processing unit to an ejection transfer unit by rotation of each drive shaft.

With (9) above an operation whereby parts after processing can be transferred to the ejection transfer unit is also possible in addition to transferring parts to the process unit.

(10) A part transfer apparatus according to another aspect of the present invention is as in any of (2) to (9) above wherein the first holding device and the second holding device each have multiple holding heads.

With (10) multiple parts can be simultaneously held and transferred.

(11) A part transfer apparatus according to another aspect of the present invention is as in (10) above wherein the holding heads have a vacuum chucking means for vacuum chucking parts.

With (11) above parts can be vacuum chucked.

(12) A part transfer apparatus according to another aspect of the present invention is as in (11) above wherein the multiple holding heads are arranged in line.

(13) A part transfer apparatus according to another aspect of the present invention is as in (11) above wherein the multiple holding heads are arranged in a matrix.

(14) A part transfer apparatus according to another aspect of the present invention is as in (8) or (9) above wherein the process unit performs electrical characteristics tests on the part as the specific process.

(15) A control method for a part transfer apparatus according to a first aspect of the present invention independently drives the first drive shaft and second drive shaft in a part transfer apparatus as described in any of (2) to (13) above.

Because each of the holding and transfer mechanisms operates independently, (15) above enables control whereby when transferring parts held in the holding device to a specific position, the other holding and transfer mechanism can be made to wait with a part held in each holding device while the one holding and transfer mechanism is transferring, and index time can be shortened.

(16) A control method for a part transfer apparatus according to another aspect of the invention causes the second holding and transfer mechanism holding an unprocessed part picked up at the supply transfer unit to wait at a standby position by means of rotating the second drive shaft while the first holding and transfer mechanism is positioned at the process unit in a part transfer apparatus as described in (8) or (9) above.

With (16) above the distance travelled to the process unit is shorter and index time can be shortened because while one holding and transfer mechanism is positioned at the process unit, the other holding and transfer mechanism holding an unprocessed part picked up at the supply transfer unit can be made to wait at a standby position.

(17) A control method for a part transfer apparatus according to another aspect of the present invention is as in (16) above wherein the standby position is set to a position in a plane perpendicular to the drive shaft at an angle of 180 degrees or less to the process unit around the drive shaft.

Because the standby position is set to a position in a plane perpendicular to the drive shaft at an angle of 180 degrees or less to the process unit around the drive shaft with (17) above, the distance moved when moving the holding device to the process unit can be shortened compared with a mechanism of the prior art in which it is fixed at a position 180 degrees opposite, the index time can be shortened, and the position can be set freely within the above range according to the shape of the holding device.

(18) A control method for a part transfer apparatus according to another aspect of the present invention is as in (16) or (17) above wherein the standby position is set at a proximal position where there is no mutual interference between the first holding device and second holding device.

(19) A control method for a part transfer apparatus according to another aspect of the present invention is as in any of (16) to (18) above wherein the rotational direction of each drive shaft when a part is transferred from the supply transfer unit to the process unit alternately changes.

(20) A control method for a part transfer apparatus according to another aspect of the present invention is as in any of (16) to (18) above wherein the rotational direction of each drive shaft when a part is transferred from the supply transfer unit to the process unit is the same direction.

(21) A control method for a part transfer apparatus according to another aspect of the present invention is as in any of (16) to (20) above wherein the first holding and transfer mechanism and second holding and transfer mechanism are made to wait at a standby position after picking up at the supply transfer unit after ejecting a processed part at the ejection transfer unit.

In addition to transferring parts from the supply transfer unit to the process unit, it is also possible to transfer processed parts to the ejection transfer unit with (21) above.

(22) A control method for a part transfer apparatus according to another aspect of the present invention is as in any of (16) to (21) above wherein the part is an IC and the process unit performs electrical characteristics tests on the IC as the specific process.

With (22) above it is also possible to achieve the above-described effects in a so-called IC handler.

(23) An IC test method according to an aspect of the present invention is IC test method for performing electrical characteristics tests of ICs under a specified temperature environment, comprising a supply step for supplying an untested IC; a test step for testing electrical characteristics of the untested IC; an ejection step for ejecting a tested IC; and transferring the IC between a supply position for supplying untested ICs, a process position for testing electrical characteristics of the untested ICs, and an ejection position for ejecting tested ICs using a part transfer apparatus as described in any of (1) to (14) above.

Because a part transfer apparatus as described in any of (1) to (14) above is used for IC transfer with (23) above, an IC test method whereby index time can be shortened, test efficiency is good, the effects of vibration are prevented, and testing is possible in a stable environment can be achieved.

(24) An IC test method according to another aspect of the present invention is as in (23) above further comprising a temperature control step for temperature adjusting untested ICs under a specific temperature environment, the temperature control step adjusting the untested ICs to a specific temperature environment by cyclically moving trays in a chamber held to a specific internal temperature environment and storing a plurality of trays storing a plurality of untested ICs.

(25) An IC handler according to an aspect of the present invention has a part transfer apparatus according to any of (1) to (14) above, said part being an IC, for transferring ICs to the process unit for electrical characteristics testing of the ICs, the IC handler comprising a supply unit, a supply mechanism, a supply shuttle, a transfer mechanism, an ejection shuttle, an ejection unit, and an ejection mechanism; the part transfer apparatus comprising a supply transfer unit, the supply transfer unit configured with a plurality of trays for transferring untested ICs to the holding and transfer mechanism; the supply unit having a plurality of supply trays storing a plurality of untested ICs; the supply mechanism comprising a supply suction mechanism for vacuum chucking an IC, a planar movement mechanism for moving the supply suction mechanism in a planar direction, and an elevator mechanism for moving the supply suction mechanism in a direction perpendicular to this plane, and removing untested ICs from the supply tray in the supply unit and supplying the untested ICs to the supply shuttle by moving the supply suction mechanism by means of the planar movement mechanism and elevator mechanism; the supply shuttle performing above the supply transfer unit an operation for receiving untested ICs removed from the supply tray by the supply suction mechanism of the supply mechanism at a first untested IC receiving position from the supply suction mechanism, then moving to a first untested IC transfer position for transferring the untested ICs to the supply transfer unit of the part transfer apparatus, and returning to the first untested IC receiving position when the transfer is completed; the transfer mechanism comprising a transfer suction mechanism able to move up and down, and configured to vacuum chuck an untested IC from the supply shuttle positioned at the first untested IC transfer position and rise, then descend, and transfer the untested IC to a tray of the supply transfer unit appearing directly thereunder by means of the supply shuttle moving to the first untested IC receiving position, by means of the transfer suction mechanism; the supply transfer unit being configured to sequentially cycle a plurality of trays by positioning the multiple trays one at a time to a second untested IC receiving position positioned directly below the first untested IC transfer position, and to a second untested IC transfer position for transferring untested ICs to the holding and transfer mechanism, moving an empty tray to the second untested IC receiving position after transferring untested ICs to the holding and transfer mechanism at the second untested IC transfer position, and moving a tray holding untested ICs to be tested next to the second untested IC transfer position; the ejection shuttle being configured to perform above the supply transfer unit an operation for receiving at a tested IC receiving position located directly above the second untested IC transfer position tested ICs processed by the process unit and removed from a tray of the supply transfer unit by the holding and transfer mechanism, then moving to a tested IC transfer position for transferring the tested ICs to the ejection mechanism, and when transfer is completed returning to the tested IC receiving position; the ejection unit comprising a plurality of ejection trays for holding a plurality of tested ICs and configured to store tested ICs in groups according to test results at the process unit; and the ejection mechanism comprising an ejection suction mechanism for vacuum chucking ICs, a planar movement mechanism for moving the ejection suction mechanism in a planar direction, and an elevator mechanism for moving the ejection suction mechanism in a direction perpendicular to this plane, and configured to remove a tested IC from the ejection shuttle positioned at the tested IC transfer position and eject the tested IC to an ejection tray of the ejection unit according to test results in the process unit by moving the ejection suction mechanism by means of the planar movement mechanism and elevator mechanism.

An IC handler offering the effects described above can be achieved by (25) above.

(26) An IC handler according to another aspect of the present invention is as in (25) above further comprising a chamber internally housing the supply transfer unit and maintaining a specific internal temperature environment, and bringing the untested ICs to the specific temperature by means of the chamber while held in the plural trays of the supply transfer unit.

(27) An IC handler according to another aspect of the present invention is as in (26) above further comprising a hot plate for heating tested ICs to normal temperature before ejection to the ejection unit.

With (27) condensation on the tested ICs can be prevented when the electrical characteristics tests are performed at a low temperature.

(28) An IC handler according to another aspect of the present invention is as in any of (25) to (27) above wherein the transfer mechanism is disposed directly above the first untested IC transfer position.

(29) An IC test apparatus according to an aspect of the present invention has a test head having the process unit, a tester connected to the test head and running an IC electrical characteristics test in the process unit, and an IC handler as described in any of (25) to (28) above for transferring ICs to the process unit.

An IC test apparatus offering the effects described above can be achieved by (29) above.

BRIEF DESCRIPTION OF THE DRAWINGS

FIG. 1 is a front section view of a part transfer apparatus according to a preferred embodiment of the present invention;

FIG. 2 is a front section view of the major parts of the holding and transfer mechanism shown in FIG. 1;

FIG. 3 is a side view of FIG. 2;

FIG. 4 is an oblique schematic view of the holding and transfer mechanism shown in FIG. 1;

FIG. 5 is a block diagram of the configuration shown in FIG. 1;

FIG. 6 is an oblique schematic diagram of the inside axis in FIG. 4 rotated 60 degrees;

FIG. 7 describes the standby position;

FIG. 8 is an oblique schematic view of the inside axis in FIG. 4 rotated a further 120 degrees and the outside axis rotated 180 degrees;

FIG. 9 is a first figure showing a linear arrangement of the holding devices;

FIG. 10 is a second figure showing a linear arrangement of the holding devices;

FIG. 11 shows a matrix arrangement of the holding devices;

FIG. 12 shows a single holding device;

FIG. 13 is a first oblique view of the holding and transfer mechanism for the arrangement shown in FIG. 9;

FIG. 14 is a second oblique view of the holding and transfer mechanism for the arrangement shown in FIG. 9;

FIG. 15 is a third oblique view of the holding and transfer mechanism for the arrangement shown in FIG. 9;

FIG. 16 is a schematic side view of the IC handler;

FIG. 17 is a schematic plan view of the IC handler;

FIG. 18 shows the overall configuration of an IC test apparatus equipped with an IC handler as shown in FIG. 16 and FIG. 17; and FIG. 19 is an oblique schematic view showing a transfer apparatus according to the prior art.

BEST MODE FOR ACHIEVING THE INVENTION

FIG. 1 is a front section view of a part transfer apparatus according to a preferred embodiment of the present invention, FIG. 2 is a front section view of the holding and transfer mechanism shown in FIG. 1, FIG. 3 is a side view of FIG. 2, FIG. 4 is an oblique schematic view of the holding and transfer mechanism shown in FIG. 1, and FIG. 5 is a block diagram of the configuration shown in FIG. 1. This embodiment is described using as an example of a part transfer apparatus an IC handler for transferring an IC device as a part from a supply transfer unit to a process unit performing an electrical characteristics test as a specific process. Inside the chamber insulation wall is temperature controlled to a set embodiment so that the electrical characteristics tests are performed at a high temperature or low temperature with this IC handler.

As shown in FIG. 1 this IC handler has a supply transfer unit 1 for supplying untested ICs, a process unit 2 for testing the electrical characteristics of the IC, a hollow drive shaft 3 having two coaxial shafts disposed on the inside and outside, a drive system 4 connected to one end of the drive shaft 3 for separately rotationally driving each drive shaft 3, holding and transfer mechanisms 5, 6 connected to the other end of drive shaft 3 and moved between the supply (eject) position and the process position by means of rotation of each drive shaft 3, an ejection transfer unit 7 whereby the tested IC is ejected, a supply/ejection slider mechanism drive unit 8 disposed to the outside wall of chamber insulation wall 10 opposite supply transfer unit 1 and ejection transfer unit 7 for driving supply/eject cylinder 8a, and process slider mechanism drive unit 9 disposed to the outside wall of chamber insulation wall 10 opposite the process unit 2 for driving process cylinder 9a. It should be noted that in FIG. 1 holding and transfer mechanism 5 is positioned over the supply transfer unit 1 and holding and transfer mechanism 6 is positioned over the process unit 2.

The supply transfer unit 1 is the part for supplying untested ICs and is configured with plural stacked trays each holding plural untested ICs; when all ICs have been removed from the topmost tray stopped at supply position P1, the tray in the next level is raised and moved to the supply position P1 by a drive means not shown in the figures. The ICs are supplied in a horizontal position at this supply transfer unit 1.

The process unit 2 has a test pad not shown in the figures corresponding to the external pins of the IC, and is the part that performs electrical characteristics tests on the IC through contact of the external pins of the IC with the test pad; this process unit 2 is disposed on a vertical surface of the chamber insulation wall 10 for testing the ICs in a vertical orientation.

The drive shaft 3 passes rotatably through a through-hole 11 in chamber insulation wall 10, and is supported on the chamber insulation wall 10 inclined 45 degrees to the supply transfer unit 1 and process unit 2. As noted above this drive shaft 3 is hollow with two coaxial shafts disposed on the inside and outside, drive system 4 connected to the top end of inside shaft 3a and outside shaft 3b for driving each shaft, and holding and transfer mechanisms 5, 6 connected to the bottom end so that holding and transfer mechanisms 5, 6 can operate independently.

The drive shaft 3 is also located on the same plane as the center of process unit 2 and supply transfer unit 1, and process unit 2 and supply transfer unit 1 are located symmetrically to the axis of drive shaft 3.

The drive system 4 is comprised of drive elements capable of stopping inside shaft 3a and outside shaft 3b at desired positions so that holding and transfer mechanisms 5, 6 can be stopped at a desired position (such as the standby position described below) other than at the supply transfer unit 1 and process unit 2. The drive elements for this are comprised of, for example, a servo motor and a speed reducer for reducing the speed of motor rotation.

With this drive system 4 rotation from driving by server motors 13a, 13b is transferred to input shafts 23a, 23b of speed reducers 21a, 21b by drive belts 19a, 19b and pulleys 17a, 17b disposed rotationally integral to motor shafts 15a, 15b, and as a result inside shaft 3a rotates integrally with bearing 25a and rotating member 27a, and outside shaft 3b rotates integrally with bearing 25b and rotating member 27b.

The drive system 4 thus comprised is housed in a housing 29 affixed to the chamber insulation wall 10, and is mounted to the chamber insulation wall 10 by means of cylindrical connecting member 33 at the bottom end of cylindrical member 31 attached to the outside circumference of bearings 25a, 25b.

FIG. 2 is an enlarged view of the holding and transfer mechanism as shown in FIG. 1, FIG. 3 is a side view of FIG. 2, and FIG. 4 is an oblique schematic view of the holding and transfer mechanism shown in FIG. 1.

The holding and transfer mechanisms 5, 6 each have a holding device 5a, 6a for holding an IC, and each holding device 5a, 6a has a plurality of holding heads 35, 36 for vacuum chucking an IC by means of vacuum head 41. This embodiment has four holding heads, and each of the holding heads is mounted in line on the bottom of mounting plate 43. A pair of shafts 45, 46 is affixed on the top surface of mounting plate 43 projecting therefrom, and the holding and transfer mechanisms 5, 6 support the holding devices 5a, 6a so that they can slide in the direction perpendicular to the support surface by means of a support mechanism slidably supporting this pair of shafts 45, 46.

This support mechanism comprises a bearing 49 slidably axially supporting shafts 45, 46, a pair of cylindrical member 47a and cylindrical member 47 outside thereof in the axial direction for holding bearing 49 to shafts 45, 46, and a connecting rod 55 fastened between cylindrical members 47. A spring 51 is inserted over the top of cylindrical member 47, constantly urging holding head 35 up as seen in the figures and holding head 36 to the right. It should be noted that the pair of shaft 45 and shaft 46 is disposed on the inside and outside on the mounting plate 43 so that they do not mutually interfere.

The holding and transfer mechanisms 5, 6 thus comprised are mounted to the bottom end of drive shaft 3 so that the holding surfaces of holding devices 5a, 6a are at a 45 degree angle to the drive shaft 3 and move between supply transfer unit 1 (ejection transfer unit 7) and process unit 2 by means of inside shaft 3a and outside shaft 3b rotation. Note that the holding and transfer mechanisms are mounted to the respective shafts using connecting members 53, 57 split in the direction of drive shaft 3, and the above-noted support mechanism (here particularly connecting rod 55); holding and transfer mechanism 5 is mounted to inside shaft 3a by fixing one end of connecting member 53 to connecting rod 55 and the other end to inside shaft 3a; and holding and transfer mechanism 6 is mounted to outside shaft 3b by fixing one end of connecting member 57 to connecting rod 55 and the other end to outside shaft 3b. A spacer 59 with a shaft hole is fit to the outside of inside shaft 3a to maintain a gap to outside shaft 3b.

The supply/eject cylinder 8a driven by supply/ejection slider mechanism drive unit 8 pushes shaft 45 of holding and transfer mechanism 5 positioned to the supply transfer unit 1 in opposition to spring 51, and thus moves holding device 5a in the axial direction. The descent of this supply/eject cylinder 8a is set to a first specific travel distance or a second specific travel distance (where first specific travel distance>second specific travel distance), and holding device 5a is positioned to either supply position P1 or eject position P2 by means of these settings.

The process cylinder 9a driven by process slider mechanism drive unit 9 moves to the left a specific distance pushing shaft 46 against the force of spring 51 of holding and transfer mechanism 6 positioned at the process unit 2, and the holding device 6a is thus positioned to the processing position P3.

Each holding head 35, 36 has a bolt 61 used as a slide guide, and shaft positioning pins 61a on bolts 61 enter positioning holes (not shown in the figure) in process unit 2, supply transfer unit 1, and ejection transfer unit 7 for precise positioning. A spring 67 is interposed between a plate 63 in contact with the bottom of mounting plate 43 and a plate 65 to which bolt 61 is fixed so that when an IC vacuum chucked to the holding head 35, 36 is pushed to the process unit 2, the IC reliably follows the test pad of the process unit 2.

The ejection transfer unit 7 is configured to travel reciprocally right to left along a horizontal plane, sliding from the retracted position to the left to standby at the eject position P2 after an IC is supplied at supply position P1, and sliding right to return to the retracted position after the tested IC is ejected.

FIG. 5 is a block diagram showing the configuration of a part transfer apparatus according to a preferred embodiment of the invention.

As shown in the figure, this configuration comprises server motors 13a, 13b for driving inside shaft 3a and outside shaft 3b; vacuum system solenoids 71a, 71b connected to vacuum head 41 and a vacuum system not shown in the figures; process slider mechanism drive unit 9 for driving process cylinder 9a; supply transfer unit 1; ejection transfer unit 7; supply/ejection slider mechanism drive unit 8; controller 72 for controlling these components; process unit 2 for testing IC electrical characteristics; and host controller 73 controlling the overall IC handler including the controller 72 and process unit 2, controller 72 and host controller 73 each having a program for controlling the parts respectively controlled thereby.

Operation of an IC handler thus comprised is described next below with reference to accompanying figures.

When the vacuum head 41 of each holding head 36 has vacuum chucked an untested IC and the holding device 6a is positioned to the process unit 2 by rotation of outside shaft 3b, process slider mechanism drive unit 9 drives the process cylinder 9a to move a specific distance left, thereby moving holding device 6a to processing position P3 so that each holding head 36 presses the vacuum chucked ICs to the test pad of process unit 2.

The vacuum head 41 of each holding head 35 meanwhile has an IC that has finished testing vacuum chucked thereto, and the holding device 5a reaches the ejection transfer unit 7 already standing by at the eject position P2 as a result of inside shaft 3a rotating 180 degrees in the same direction as and simultaneously to the above-noted rotation of outside shaft 3b. Supply/ejection slider mechanism drive unit 8 then drives to lower supply/eject cylinder 8a the second specific travel distance, pushing shaft 45 down against the force of spring 51. Each holding head 35 of holding device 5a thus descends gradually to the ejection transfer unit 7 accurately positioned as a result of guidance by the shaft positioning pins 61a of bolts 61. When holding head 35 descends to the eject position P2, vacuum system solenoid 71a closes, the vacuum of vacuum head 41 is released, the tested IC is ejected to the ejection transfer unit 7, and the holding head 35 then rises and waits. During this time the ejection transfer unit 7 to which the tested IC was ejected slides to the right to pass the tested IC to the next process and moves to the retracted position.

When the supply transfer unit 1 waiting at supply position P1 below eject position P2 appears at the position opposite holding device 5a due to retraction of the ejection transfer unit 7, supply/ejection slider mechanism drive unit 8 drives to lower the supply/eject cylinder 8a the first specific travel distance, and holding device 5a thus reaches supply position P1 below its previous position. When a vacuum system not shown in the figures then operates in conjunction with vacuum system solenoid 71a opening, each holding head 35 vacuum chucks an IC from the topmost tray in the supply transfer unit 1 by means of vacuum head 41. After chucking, the supply/ejection slider mechanism drive unit 8 drives to raise supply/eject cylinder 8a, and as a result holding device 5a gradually rises in conjunction with the rise of supply/eject cylinder 8a due to the force of spring 51, and returns to the top position.

The holding device 5a performs the tested IC ejection operation and untested IC supply operation while the holding device 6a is positioned at the process unit 2 and electrical characteristics testing or other process is under way, and if when these operations are completed and the holding device 5a returns to the top position holding device 6a is still positioned at the process unit 2 and processing continues, inside shaft 3a is turned a specific distance (60 degrees in this example) so that the holding device 5a stands by at the standby position in order to shorten the index time.

FIG. 6 is an oblique schematic view of the holding and transfer mechanisms 5, 6 at this time, and FIG. 7 is a view looking at the holding and transfer mechanisms 5, 6 from the direction of arrow B on an extension of axis of rotation A in FIG. 6 to explain this standby position. Note that the dotted line in FIG. 7 indicates the holding device 5a before moving to the standby position (that is, holding device 5a when positioned at supply position P1 or eject position P2).

As shown in the figures, by rotating inside shaft 3a 60 degrees, holding device 5a stands by at a position 120 degrees to process unit 2 around drive shaft 3 (axis of rotation A) in a plane perpendicular to the drive shaft 3. As will be known from the figures, the travel distance can thus be shortened to ⅔ of the distance travelled when moving to the process unit 2 from a position 180 degrees from the process unit 2, and the index time can be shortened. It should be noted that this standby position is preferably set as close as possible to the process unit 2. More specifically, the standby position is affected by the number of simultaneously tested parts (4 in this example), the arrangement of the holding heads (linear in this example), and the size of the holding device (holding head), and is set so that the holding device 5a positioned in the standby position does not interfere with the other holding device 6a positioned at the process unit 2.

When testing the IC vacuum chucked by vacuum head 41 of holding head 36 is completed, holding device 6a moves to the right in conjunction with operation of process cylinder 9a moved to the right by process slider mechanism drive unit 9, and returns to the rightmost position. After returning, outside shaft 3b rotates 180 degrees in the same direction as rotation of inside shaft 3a in conjunction with movement to the standby position, and holding device 6a separates from the process unit 2 and moves to ejection transfer unit 7. At the same time inside shaft 3a rotates a further 120 degrees, and holding device 5a moves from the standby position to the process unit 2 with the untested ICs vacuum chucked to the vacuum head 41. FIG. 8 is an oblique schematic view showing each holding and transfer mechanism in this position.

The holding device 5a having reached the process unit 2 slides to processing position P3 through the same operation described above for holding device 6a, and pushes the untested ICs to the process unit 2 for testing. While the holding device 5a is processing at the process unit 2, holding device 6a reaches the ejection transfer unit 7 delayed from holding device 5a reaching process unit 2, and by performing the same operation as holding device 5a described above ejects the processed IC to the ejection transfer unit 7 waiting at the eject position P2, and then vacuum chucks an IC from supply transfer unit 1. Processing after this is a repeat of the operation described above with holding device 5a and holding device 6a interchanged.

An operation whereby untested ICs are vacuum chucked and transferred to the process unit 2 and tested ICs are transferred from the process unit 2 to the ejection transfer unit 7 while rotating inside shaft 3a and outside shaft 3b repeats continuously. It should be noted that the rotational direction of the drive shaft 3 when moving the holding device from supply transfer unit 1 to process unit 2 can alternately reverse or always be the same direction. In the former case the holding devices rotate in the opposite direction after processing at the process unit 2 to return to the ejection transfer unit 7 and supply transfer unit 1, and in the latter case rotate in the same direction as the direction of rotation moving to the process unit 2 to return to the ejection transfer unit 7 and supply transfer unit 1.

By thus enabling the holding and transfer mechanisms 5, 6 to operate independently and making the holding device holding the next untested ICs wait in a standby position while the ICs are being tested, the present embodiment of the invention can shorten the index time compared with a conventional transfer apparatus comprising a single drive shaft with two pick-up heads mounted to the drive shaft in a plane perpendicular to the drive shaft at positions offset 180 degrees on opposite sides of the drive shaft.

Furthermore, the positions of the holding devices can be independently corrected because the drive systems for each shaft are separately configured. It is therefore also possible to adapt flexibly to shifting of positions resulting from thermal expansion and contraction due to changes in the set temperature.

Furthermore, separating the drive systems also reduces the inertia of each drive system, facilitates a speed increase because high speed and high speed rotation of the drive system is possible, and thus contributes to shortening the index time.

Furthermore, separating the drive systems also makes it more difficult for vibration during operation to be transmitted to the other drive system, and the effects of vibration on the process performed by the other holding device can be reduced. Measurement of electrical characteristics and other processes at the process unit 2 can therefore be performed stably.

It should be noted that the above embodiment has been described using by way of example four linearly aligned holding devices, but the invention shall not be so limited and arrangements such as described below can also be used. These alternative arrangements are described with reference to FIGS. 9 to 12.

FIG. 9 to FIG. 12 show other sample arrangements.

FIG. 9 and FIG. 10 show linear arrangements (in-line arrangements), FIG. 9 showing two located in the circumferential direction using axis of rotation A (drive shaft 3) as the origin in a plane perpendicular to the drive shaft 3, and FIG. 10 shows two arranged in the radial direction with axis of rotation A (drive shaft 3) as the origin in the same plane. FIG. 11 shows an example of a matrix arrangement, particularly one with four. FIG. 12 shows an arrangement with just one.

This embodiment has also been described with the standby position at a position 120 degrees from the process unit 2 in a plane perpendicular to the drive shaft 3 using axis of rotation A (drive shaft 3) as the origin, but the invention shall not be so limited and the standby position can be set appropriately according to the number of simultaneous measurements, the arrangement of the holding heads, and the size of the holding devices (holding heads). Using the configurations in FIG. 9 to FIG. 12 for example, a position at 90 degrees could be set when two are measured simultaneously and arranged in-line in the circumferential direction (see FIG. 9), 60 degrees could be set when two are measured simultaneously and arranged in-line in the radial direction (see FIG. 10), 90 degrees could be set when four are measured simultaneously and arranged in a matrix (see FIG. 11), and 60 degrees could be set when one is measured at a time (see FIG. 12). It should be noted that these are described by way of example only, and by shrinking the holding device the standby position can be set even closer to the process unit 2. In any case, the standby position is preferably set near the process unit 2, the setting range of the standby position is within 180 degrees from the process unit 2 around axis of rotation A (drive shaft 3) in a plane perpendicular to the drive shaft 3, and can be set freely within this range according to the shape of the holding device, for example, while the conventional mechanism is fixed at 180 degrees.

It should be noted that the distance travelled when a holding device holding an untested IC is interchanged at the process unit 2 can be shortened ⅓ to ⅔ the travel distance of the prior art when the standby position is thus set from 60 degrees to 120 degrees, the index time can therefore be significantly shortened, the processing capacity of the part transfer apparatus (here the IC handler) can be improved, and productivity can be improved.

Furthermore, as also noted above the rotational direction of the drive shaft 3 when transferring an untested IC from the supply transfer unit 1 to the process unit 2 can be always in the same direction or can alternately change. The holding devices at each standby position when the direction of rotation changes each time is as shown in FIG. 13 and FIG. 14 using the arrangement shown in FIG. 9 (that is, two arranged in-line in the circumferential direction for simultaneous measurement with the standby position at 90 degrees) by way of example. It should be noted that the standby position can be located on either side of the process unit 2, FIG. 13 shows holding device 6a waiting at a position −90 degrees to the process unit 2, and FIG. 14 shows it waiting at a 90 degree position. FIG. 15 shows the holding device 5a waiting at a position 90 degrees to the process unit 2 when the holding device 6a is positioned at the process unit 2.

When moving from supply transfer unit 1 to process unit 2 the present embodiment waits at a standby position, but if processing at the process unit 2 has already been completed it is also possible to move directly to the process unit 2 without waiting at the standby position. In this case inside shaft 3a and outside shaft 3b simultaneously rotate 180 degrees, and holding device 5a and holding device 6a simultaneously reach the process unit 2 and supply transfer unit 1 (ejection transfer unit 7). Operation in this case is the same as with the conventional transfer apparatus and some of the benefits described above will not be achieved, but such benefits as reducing transmission of vibrations to the other holding device and enabling independent positioning at each holding device can still be achieved.

Furthermore, the present embodiment has been described transferring parts between positions on mutually perpendicular planes, but transfer within the same plane is also possible.

The part transfer apparatus shown in FIG. 1 is described above as an IC handler, but it will be noted that it is actually one part of the mechanical units forming an IC handler (the mechanical unit shown in FIG. 1 is referred to below as an IC transfer unit), and the overall configuration and operation of an IC handler is described below with reference to FIG. 16 and FIG. 17.

FIG. 16 is a schematic side view of an IC handler, and FIG. 17 is a schematic plan view of the IC handler.

In addition to the above-described IC transfer unit (denoted by reference numeral 600 in FIGS. 16 and 17), IC handler 200 has a supply unit 300 for storing multiple untested ICs, an empty tray storage unit 310 for storing empty trays, a supply mechanism 400 for transferring untested ICs from supply unit 300 to a supply shuttle 500 described below, a supply shuttle 500 for internal transport in the IC handler for supplying untested ICs received from the supply mechanism 400 to the IC transfer unit 600, an ejection shuttle 700 for internal transport in the IC handler for ejecting tested ICs from the IC transfer unit 600, an ejection mechanism 800 for transferring tested ICs from the ejection shuttle 700 to the ejection unit 900 described below, and a hot plate 1000 for first warming to normal temperature when low temperature tests are performed in the chamber (at 10 degrees C. or less, for example) before transferring the low temperature tested ICs to the ejection unit 900 to prevent condensation.

It should be noted that ejection shuttle 700 is disposed to the ejection transfer unit 7 in FIG. 1, and this ejection shuttle 700 travels left and right as shown in FIG. 1, but in the layout shown in FIG. 16 it moves in the direction perpendicular to the paper surface (direction Y).

The supply unit 300 has a supply elevator 301 configured to support a stack of multiple supply trays each storing multiple untested ICs and capable of moving the plural stacked supply trays up and down such that the next supply tray in the stack is pushed up to the topmost position when all ICs have been vacuum chucked and removed from the topmost supply tray. Note that the emptied tray is moved by tray transport arm 910 to empty tray storage unit 310.

The supply mechanism 400 has a movable arm 401 mounted to the bottom of a y-direction rail 405 (part of which is omitted in FIG. 17) so that it can move reciprocally in the y-direction, and a supply vacuum chucking hand 403 part of which is omitted in FIG. 17) mounted on the bottom of movable arm 401 so that it moves up and down and operates reciprocally in the x-direction. The supply vacuum chucking hand 403 picks up an IC from the topmost supply tray of the supply unit 300, rises and moves to directly above untested IC receiving position P4, descends, and supplies the vacuum chucked untested IC to the supply shuttle 500 positioned at the untested IC receiving position P4.

The supply shuttle 500 is configured to operate reciprocally in the x-direction for positioning at untested IC receiving position P4 for receiving an untested IC from supply vacuum chucking hand 403 of supply mechanism 400, and untested IC transfer position P5 for transferring the untested IC to IC transfer unit 600, and repeats the operation of moving to untested IC transfer position P5 when an untested IC is received from supply vacuum chucking hand 403 of supply mechanism 400 at untested IC receiving position P4, and then returning to untested IC receiving position P4 when at untested IC transfer position P5 the untested IC is removed by a transfer mechanism (not shown in the figure) disposed directly above the untested IC transfer position P5 and the supply shuttle 500 becomes empty.

The transfer mechanism not shown in the figure has a pick-up hand capable of moving up and down, and by means of said pick-up hand performs the operation of transferring an untested IC removed from supply shuttle 500 positioned at untested IC transfer position P5 to one of two topmost trays in the supply transfer unit 1, specifically, to the tray stopped at the untested IC receiving position P6 (equivalent to directly below the above-noted untested IC transfer position P5 (see FIG. 16) and the same as supply position P1 in FIG. 1) toward the front as seen in FIG. 17.

The supply transfer unit 1 is configured so that trays holding multiple untested ICs are stored in stacks of plural trays, and is more specifically configured with multiple trays in two columns front and back as seen in FIG. 17. When of these multiple trays the one topmost tray positioned at untested IC receiving position P6 receives an untested IC from the transfer mechanism, it is pushed down and the other topmost tray stopped at untested IC transfer position P7 simultaneously moves forward as seen in FIG. 17 to the untested IC receiving position P6, and the next tray on the untested IC transfer position P7 side is pushed up and positioned at the untested IC transfer position P7. The supply transfer unit 1 is thus configured so that multiple trays stacked in two columns front and back are sequentially cycled.

Furthermore, untested ICs on trays are gradually adjusted to the test temperature by circulating trays carrying untested ICs for temperature adjustment inside the chamber insulation wall 10 as described above so that they have reached the test temperature by the time they reach untested IC transfer position P7 in this supply transfer unit 1. In addition, when untested ICs that have reached the test temperature are picked up from the tray stopped at the untested IC transfer position P7 by holding and transfer mechanism 5 or holding and transfer mechanism 6 for testing and the tray at untested IC transfer position P7 becomes empty, the empty tray at untested IC transfer position P7 moves to untested IC receiving position P6 as described above, and the next tray holding untested ICs is pushed up to the untested IC transfer position P7.

Untested ICs picked up from the tray at untested IC transfer position P7 by holding and transfer mechanism 5 or holding and transfer mechanism 6 are submitted to tests at process unit 2 while held by holding and transfer mechanism 5 or holding and transfer mechanism 6, and are then transferred by holding and transfer mechanism 5 or holding and transfer mechanism 6 to the ejection shuttle 700 waiting at the below-described tested IC receiving position P8 equivalent to directly above untested IC transfer position P7.

The ejection shuttle 700 is configured to operate reciprocally in the y-direction for positioning alternately to a tested IC receiving position P8 where a tested IC supplied for testing at the process unit 2 is received from the holding and transfer mechanism 5 or holding and transfer mechanism 6 and a tested IC transfer position P9 for transferring the tested IC to ejection mechanism 800, and repeats an operation of moving to the tested IC transfer position P9 when a tested IC is received from holding and transfer mechanism 5 or holding and transfer mechanism 6 at the tested IC receiving position P8, and then returning to the tested IC receiving position P8 when it becomes empty after the tested ICs are removed by the ejection mechanism 800.

The ejection unit 900 has ejection elevators 901, 903, 905 configured to support multiple stacked ejection trays for recovering tested ICs and move the full ejection tray down when the ejection tray set on top is filled with tested ICs, and ejection trays 907, 909, 911, and stores the tested ICs grouped according to the test results in each ejection tray inside the ejection elevators 901, 903, 905 and in ejection trays 907, 909, 911. It should be noted that when a full ejection tray is moved down in ejection elevators 901, 903, 905, an empty tray is transferred from the empty tray storage unit 310 by tray transport arm 910 and placed in the topmost position.

Similarly to the supply mechanism 400, the ejection mechanism 800 has a movable arm 801 mounted to the bottom of y-direction rail 405 so that it can move reciprocally in the y-direction, and a pick-up hand mounted on the bottom of movable arm 801 so that it moves up and down and operates reciprocally in the x-direction. The pick-up hand picks up and removes tested ICs from the ejection shuttle 700 positioned at tested IC transfer position P9, rises and then moves to a particular ejection tray according to the test results at either the topmost ejection tray of ejection elevators 901, 903, 905 in ejection unit 900 or one of ejection trays 907, 909, 911, then descends and ejects the tested ICs to the ejection tray.

The IC handler 200 thus comprised first transfers untested ICs by means of supply mechanism 400 from the supply unit 300 to the supply shuttle 500 positioned at untested IC receiving position P4. The supply shuttle 500 then moves to untested IC transfer position P5 and the untested ICs are transferred from the supply shuttle 500 positioned at untested IC transfer position P5 to a tray positioned at untested IC receiving position P6 in supply transfer unit 1.

Untested ICs that have reached the test temperature are then removed by holding and transfer mechanism 5 or holding and transfer mechanism 6 from the tray positioned at untested IC transfer position P7 due to the tray circulation movement performed by the supply transfer unit 1, and transferred to the process unit 2 for testing. The holding and transfer mechanism 5 or holding and transfer mechanism 6 transfers tested IC devices to the ejection shuttle 700 waiting at tested IC receiving position P8. The ejection shuttle 700 then moves to tested IC transfer position P9, and the tested ICs are ejected from the ejection shuttle 700 positioned at tested IC transfer position P9 to the ejection unit 900 by ejection mechanism 800. It should be noted that if testing is performed in low temperature conditions, the tested ICs are first transported over hot plate 1000 and returned to normal temperature before being transported to the ejection unit 900, and are then transported to ejection unit 900.

With the overall configuration and operation of the IC handler 200 now clear, an IC test apparatus comprising the IC handler 200 is described next with reference to the next figure.

FIG. 18 shows the overall configuration of an IC test apparatus equipped with an IC handler as shown in FIG. 16 and FIG. 17.

The IC test apparatus 210 has, as shown in the figure, test head 220, tester 230, and IC handler 200 shown in FIG. 16 and FIG. 17. The test pad of the above-described process unit 2 is more accurately disposed to the test head 220, and the IC test apparatus 210 is an apparatus whereby ICs are transported to the test pad disposed to test head 220 by means of IC handler 200, the electrical characteristics of ICs on the test pad are tested by the tester 230 connected to the test head 220, and the ICs are then appropriately sorted and transferred to the appropriate location according to the test results.

Because the IC test apparatus 210 thus configured comprises an IC handler 200 incorporating a part transfer apparatus according to the present invention, an IC test apparatus 210 that can shorten the index time and provide efficient testing can be achieved.

It should be noted that this embodiment of the invention is described using an IC handler for transporting ICs by way of example as a part transfer apparatus, but the invention shall not be so limited.

Furthermore, this embodiment is described using an IC test apparatus applicable to testing ICs in a high temperature or low temperature environment by way of example, but it will be obvious that the part transfer apparatus of the present invention can also be applied to a IC test apparatus for testing ICs in a normal temperature environment.

Furthermore, this embodiment is described using a low temperature test (at 10° C. or less, for example) by way of example, but it will also be obvious that the temperature setting in the chamber can be freely set according to the environment in which the ICs will be used.

What is claimed is:

1. An IC test apparatus comprising a test head having a process unit, a tester connected to the test head and running an IC electrical characteristics test in the process unit, and an IC handler for transferring ICs to the process unit, the IC handler having an IC transfer apparatus for transferring ICs to the process unit for electrical characteristics testing of the ICs;

the IC transfer apparatus comprising a first drive shaft and a second drive shaft coaxially disposed, each having a corresponding drive system connected to one end and each rotationally driven by the corresponding drive system; a first holding and transfer mechanism mounted to the first drive shaft and having a first holding device for holding an IC; and a second holding and transfer mechanism mounted to the second drive shaft and having a second holding device for holding an IC;

the IC handler further comprising a supply unit, a supply mechanism, a supply shuttle, a transfer mechanism, an ejection shuttle, an ejection unit, and an ejection mechanism, and wherein:

the IC transfer apparatus further comprises a supply transfer unit, the supply transfer unit comprising a plurality of trays for transferring untested ICs to at least one of the first and second holding and transfer mechanisms;

the supply unit having a plurality of supply trays that store a plurality of untested ICs;

the supply mechanism comprising a supply suction mechanism for vacuum chucking an IC, a planar movement mechanism for moving the supply suction mechanism in a planar direction, and an elevator mechanism for moving the supply suction mechanism in a direction perpendicular to the planar direction, and removing untested ICs from the supply tray in the supply unit and supplying untested ICs to the supply shuttle by moving the supply suction mechanism using the planar movement mechanism and elevator mechanism;

the supply shuttle performing above the supply transfer unit an operation for receiving untested ICs removed from the supply tray by the supply suction mechanism of the supply mechanism at a first untested IC receiving position from the supply suction mechanism, then moving to a first untested IC transfer position for transferring the untested ICs to the supply transfer unit of the part transfer apparatus, and returning to the first untested IC receiving position when the transfer is completed;

the transfer mechanism comprising a transfer suction mechanism able to move up and down, and configured to vacuum chuck an untested IC from the supply shuttle positioned at the first untested IC transfer position and rise, then descend, and transfer the untested IC to a tray of the supply transfer unit appearing directly thereunder with the supply shuttle moving to the first untested IC receiving position, using the transfer suction mechanism;

the supply transfer unit being configured to sequentially cycle a plurality of trays by positioning the multiple trays one at a time to a second untested IC receiving position positioned directly below the first untested IC transfer position, and to a second untested IC transfer position for transferring untested ICs to the at least one of first and second holding and transfer mechanisms, and moving an empty tray to the second untested IC receiving position after transferring untested ICs to the holding and transfer mechanism at the second untested IC transfer position, and moving a tray holding untested ICs to be tested next to the second untested IC transfer position;

the ejection shuttle being configured to perform above the supply transfer unit an operation for receiving at a tested IC receiving position located directly above the second untested IC transfer position tested ICs processed by the process unit and removed from a tray of the supply transfer unit by at least one of the first and second holding and transfer mechanisms, then moving to a tested IC transfer position for transferring the tested ICs to the ejection mechanism, and when transfer is completed returning to the tested IC receiving position;

the ejection unit comprising a plurality of ejection trays for holding a plurality of tested ICs and configured to store tested ICs in groups according to test results at the process unit; and the ejection mechanism comprising an ejection suction mechanism for vacuum chucking ICs, a planar movement mechanism for moving the ejection suction mechanism in a planar direction, and an elevator mechanism for moving the ejection suction mechanism in a direction perpendicular to the planar direction, and configured to remove a tested IC from the ejection shuttle positioned at the tested IC transfer position and eject the tested IC to an ejection tray of the ejection unit according to test results in the process unit by moving the ejection suction mechanism using the planar movement mechanism and elevator mechanism.

2. An IC handler having an IC transfer apparatus for transferring ICs to a process unit for electrical characteristics testing of the ICs;

the IC transfer apparatus comprising a first drive shaft and a second drive shaft coaxially disposed, each having a corresponding drive system connected to one end and each rotationally driven by the corresponding drive system; a first holding and transfer mechanism mounted to the first drive shaft and having a first holding device for holding an IC; and a second holding and transfer mechanism mounted to the second drive shaft and having a second holding device for holding an IC;

the IC handler further comprising a supply unit, a supply mechanism, a supply shuttle, a transfer mechanism, an ejection shuttle, an ejection unit, and an ejection mechanism, and wherein:

the IC transfer apparatus further comprises a supply transfer unit, the supply transfer unit comprising a plurality of trays for transferring untested ICs to at least one of the first and second holding and transfer mechanisms;

the supply unit having a plurality of supply trays that store a plurality of untested ICs;

the supply mechanism comprising a supply suction mechanism for vacuum chucking an IC, a planar movement mechanism for moving the supply suction mechanism in a planar direction, and an elevator mechanism for moving the supply suction mechanism in a direction perpendicular to the planar direction, and removing untested ICs from the supply tray in the supply unit and supplying untested ICs to the supply shuttle by moving the supply suction mechanism using the planar movement mechanism and elevator mechanism;

the supply shuttle performing above the supply transfer unit an operation for receiving untested ICs removed from the supply tray by the supply suction mechanism of the supply mechanism at a first untested IC receiving position from the supply suction mechanism, then moving to a first untested IC transfer position for transferring the untested ICs to the supply transfer unit of the part transfer apparatus, and returning to the first untested IC receiving position when the transfer is completed;

the transfer mechanism comprising a transfer suction mechanism able to move up and down, and configured to vacuum chuck an untested IC from the supply shuttle positioned at the first untested IC transfer position and rise, then descend, and transfer the untested IC to a tray of the supply transfer unit appearing directly thereunder by means of the supply shuttle moving to the first untested IC receiving position, using the transfer suction mechanism;

the supply transfer unit being configured to sequentially cycle a plurality of trays by positioning the multiple trays one at a time to a second untested IC receiving position positioned directly below the first untested IC transfer position, and to a second untested IC transfer position for transferring untested ICs to the at least one of first and second holding and transfer mechanisms, and moving an empty tray to the second untested IC receiving position after transferring untested ICs to at least one of the first and second holding and transfer mechanisms at the second untested IC transfer position, and moving a tray holding untested ICs to be tested next to the second untested IC transfer position;

the ejection shuttle being configured to perform above the supply transfer unit an operation for receiving at a tested IC receiving position located directly above the second untested IC transfer position tested ICs processed by the process unit and removed from a tray of the supply transfer unit by the at least one of the first and second holding and transfer mechanisms, then moving to a tested IC transfer position for transferring the tested ICs to the ejection mechanism, and when transfer is completed returning to the tested IC receiving position;

the ejection unit comprising a plurality of ejection trays for holding a plurality of tested ICs and configured to store tested ICs in groups according to test results at the process unit; and the ejection mechanism comprising an ejection suction mechanism for vacuum chucking ICs, a planar movement mechanism for moving the ejection suction mechanism in a planar direction, and an elevator mechanism for moving the ejection suction mechanism in a direction perpendicular to the planar direction, and configured to remove a tested IC from the ejection shuttle positioned at the tested IC transfer position and eject the tested IC to an ejection tray of the ejection unit according to test results in the process unit by moving the ejection suction mechanism using the planar movement mechanism and elevator mechanism.

3. An IC handler as described in claim 2, further comprising a chamber internally housing the supply transfer unit and maintaining a specific internal temperature environment, and bringing the untested ICs to the specific temperature using the chamber while held in the plural trays of the supply transfer unit.

4. An IC handler as described in claim 3, further comprising a hot plate for heating tested ICs to a normal temperature before ejection to the ejection unit.

5. An IC handler as described in claim 2, wherein the transfer mechanism is disposed directly above the first untested IC transfer position.

6. An IC test method for performing electrical characteristics tests of ICs under a specified temperature environment, and using a part transfer apparatus comprising a first drive shaft and a second drive shaft coaxially disposed, each having a corresponding drive system connected to one end and each rotationally driven by the corresponding drive system; a first holding and transfer mechanism mounted to the first drive shaft and having a first holding device for holding a part; and a second holding and transfer mechanism mounted to the second drive shaft and having a second holding device for holding a part, the IC test method comprising:
  supplying an untested IC;
  testing electrical characteristics of the untested IC;
  ejecting a tested IC; and
  transferring the IC between a supply position for supplying untested ICs, a process position for testing electrical characteristics of the untested ICs, and an ejection position for ejecting tested ICs.

7. An IC test method as described in claim 6, further comprising adjusting the temperature of untested ICs under a specific temperature environment by cyclically moving trays in a chamber held to a specific internal temperature environment and storing a plurality of trays that store a plurality of untested ICs.

8. A part transfer apparatus comprising:
  a plurality of drive shafts coaxially disposed, each having a corresponding drive system connected to one end and each rotationally driven by the corresponding drive system; and
  a plurality of holding and transfer mechanisms, each mounted to a respective one of the plurality of drive shafts and each having a holding device for holding a part.

9. A part transfer apparatus comprising:
  a first drive shaft and a second drive shaft coaxially disposed, each having a corresponding drive system connected to one end and each rotationally driven by the corresponding drive system;
  a first holding and transfer mechanism mounted to the first drive shaft and having a first holding device for holding a part; and
  a second holding and transfer mechanism mounted to the second drive shaft and having a second holding device for holding a part.

10. A part transfer apparatus as described in claim 9, wherein the second drive shaft is hollow and the first drive shaft passes through and is disposed coaxially to the second drive shaft.

11. A part transfer apparatus as described in claim 10, further comprising a bearing for axially supporting one end on the drive system side of the first drive shaft and second drive shaft, and a spacer for maintaining a space between the first drive shaft and the second drive shaft being disposed at the other end in the space between the first drive shaft and second drive shaft.

12. A part transfer apparatus as described in claim 9, wherein the first holding and transfer mechanism is mounted to the first drive shaft so that a holding surface of the first holding device is at an angle of 45 degrees to the first drive shaft, and the second holding and transfer mechanism is mounted to the second drive shaft so that a holding surface of the second holding device is at an angle of 45 degrees to the second drive shaft.

13. A part transfer apparatus as described in claim 9, wherein the first holding and transfer mechanism comprises a first support mechanism for slidably supporting the first holding device in a direction perpendicular to a holding surface of the first holding device, and the second holding and transfer mechanism comprises a second support mechanism for slidably supporting the second holding device in a direction perpendicular to a holding surface of the second holding device.

14. A part transfer apparatus as described in claim 13, wherein the first holding and transfer mechanism is mounted to the first drive shaft thereby connecting the first drive shaft and the first support mechanism, and the second holding and transfer mechanism is mounted to the second drive shaft thereby connecting the second drive shaft and the second support mechanism.

15. A part transfer apparatus as described in claim 9, further comprising a controller that alternately moves the first holding and transfer mechanism and the second holding and transfer mechanism by rotation of each of the first drive shaft and the second drive shaft to a supply transfer unit for supplying parts and a process unit for applying a specific process to the parts.

16. A part transfer apparatus as described in claim 15, wherein the controller controls the first holding and transfer mechanism and the second holding and transfer mechanism to eject parts that have finished processing in the processing unit to an ejection transfer unit by rotation of each of the first drive shaft and the second drive shaft.

17. A part transfer apparatus as described in claim 9, wherein the first holding device and the second holding device each comprise multiple holding heads.

18. A part transfer apparatus as described in claim 17, wherein the multiple holding heads each has a vacuum head for vacuum chucking parts.

19. A part transfer apparatus as described in claim 18, wherein the multiple holding heads are arranged in line.

20. A part transfer apparatus as described in claim 18, wherein the multiple holding heads are arranged in a matrix.

21. A part transfer apparatus as described in claim 15, wherein the process unit performs electrical characteristics tests on the part as the specific process.

22. A control method for a part transfer apparatus comprising a first drive shaft and a second drive shaft coaxially disposed, each having a corresponding drive system connected to one end and each rotationally driven by the corresponding drive system; a first holding and transfer mechanism mounted to the first drive shaft and having a first holding device for holding a part; and a second holding and transfer mechanism mounted to the second drive shaft and having a second holding device for holding a part, the control method comprising independently driving the first drive shaft and the second drive shaft.

23. A control method for a part transfer apparatus comprising a first drive shaft and a second drive shaft coaxially disposed, each having a corresponding drive system connected to one end and each rotationally driven by the corresponding drive system; a first holding and transfer mechanism mounted to the first drive shaft and having a first holding device for holding a part; and a second holding and transfer mechanism mounted to the second drive shaft and having a second holding device for holding a part, the control method comprising controlling the second holding and transfer mechanism holding an unprocessed part picked up at a supply transfer unit to wait at a standby position by rotating the second drive shaft while the first holding and transfer mechanism is positioned at a process unit.

24. A control method for a part transfer apparatus as described in claim 23, wherein the standby position is a position in a plane perpendicular to one of the first and second drive shafts at an angle of 180 degrees or less to the process unit around the one of the first and second drive shafts.

25. A control method for a part transfer apparatus as described in claim 23, wherein the standby position is set at a proximal position where there is no mutual interference between the first holding device and second holding device.

26. A control method for a part transfer apparatus as described in claim 23, further comprising alternately changing the rotational direction of each of the first drive shaft and the second drive shaft when a part is transferred from the supply transfer unit to the process unit.

27. A control method for a part transfer apparatus as described in claim 23, further comprising setting the rotational direction of each of the first drive shaft and the second drive shaft to the same direction when a part is transferred from the supply transfer unit to the process unit.

28. A control method for a part transfer apparatus as described in claim 23, further comprising controlling the first holding and transfer mechanism and second holding and transfer mechanism to wait at a standby position after picking up an unprocessed part at the supply transfer unit after ejecting a processed part at the ejection transfer unit.

29. A control method for a part transfer apparatus as described in claim 23, wherein the part is an IC and the process unit performs electrical characteristics tests on the IC as the specific process.

* * * * *